United States Patent
Hung et al.

(10) Patent No.: US 12,324,216 B2
(45) Date of Patent: Jun. 3, 2025

(54) METAL GATES FOR MULTI-GATE DEVICES AND FABRICATION METHODS THEREOF

(71) Applicant: Taiwan Semiconductor Manufacturing Company, Ltd., Hsin-Chu (TW)

(72) Inventors: Jo-Chun Hung, Hsinchu (TW); Chih-Wei Lee, Hsinchu (TW); Wen-Hung Huang, Hsinchu (TW); Kuo-Feng Yu, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 943 days.

(21) Appl. No.: 17/461,681

(22) Filed: Aug. 30, 2021

(65) Prior Publication Data
US 2023/0065195 A1 Mar. 2, 2023

(51) Int. Cl.
*H10D 30/00* (2025.01)
*H10D 30/01* (2025.01)
*H10D 30/62* (2025.01)
*H10D 62/10* (2025.01)
*H10D 64/01* (2025.01)
*H10D 64/66* (2025.01)
*H10D 64/68* (2025.01)
(Continued)

(52) U.S. Cl.
CPC ......... *H10D 64/669* (2025.01); *H10D 30/019* (2025.01); *H10D 30/503* (2025.01); *H10D 30/6219* (2025.01); *H10D 62/121* (2025.01); *H10D 64/017* (2025.01); *H10D 64/685* (2025.01); *H10D 84/8311* (2025.01); *H10D 84/83135* (2025.01); *H10D 84/851* (2025.01)

(58) Field of Classification Search
CPC ............... H01L 29/785; H01L 29/0649; H01L 29/0665; H01L 29/0673; H01L 29/41791; H01L 29/42392; H01L 29/513; H01L 29/66439; H01L 29/66545; H01L 29/775; H01L 29/78696; H01L 29/1079; H01L 2029/7858; B82Y 10/00; H10D 30/503; H10D 30/019; H10D 30/6219; H10D 62/121; H10D 64/017; H10D 64/669; H10D 64/685; H10D 84/8311; H10D 84/83135; H10D 84/851
See application file for complete search history.

(56) References Cited

U.S. PATENT DOCUMENTS

| | | |
|---|---|---|
| 8,796,666 B1 | 8/2014 | Huang et al. |
| 8,815,712 B2 | 8/2014 | Wan et al. |
| 8,963,258 B2 | 2/2015 | Yu et al. |

(Continued)

*Primary Examiner* — Earl N Taylor
(74) *Attorney, Agent, or Firm* — HAYNES AND BOONE, LLP

(57) ABSTRACT

An n-type field effect transistor includes semiconductor channel members vertically stacked over a substrate, a gate dielectric layer wrapping around each of the semiconductor channel members, and a work function layer disposed over the gate dielectric layer. The work function layer wraps around each of the semiconductor channel members. The n-type field effect transistor also includes a WF isolation layer disposed over the WF layer and a gate metal fill layer disposed over the WF isolation layer. The WF isolation layer fills gaps between adjacent semiconductor channel members.

20 Claims, 27 Drawing Sheets

(51) Int. Cl.
*H10D 84/83* (2025.01)
*H10D 84/85* (2025.01)

(56) References Cited

U.S. PATENT DOCUMENTS

| | | | |
|---|---|---|---|
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,576,814 B2 | 2/2017 | Wu et al. | |
| 9,997,519 B1* | 6/2018 | Bao | H01L 27/092 |
| 10,319,846 B1* | 6/2019 | Ando | H01L 29/4958 |
| 10,700,064 B1* | 6/2020 | Zhang | H01L 29/78 |
| 10,804,162 B2 | 10/2020 | Wang et al. | |
| 11,637,180 B2* | 4/2023 | Lee | H01L 29/66795 |
| | | | 257/288 |
| 2013/0285116 A1 | 10/2013 | Lochtefeld et al. | |
| 2018/0090326 A1* | 3/2018 | Jagannathan | H01L 29/0665 |
| 2019/0172828 A1* | 6/2019 | Smith | H01L 21/28088 |
| 2019/0348530 A1* | 11/2019 | Ando | H01L 27/1203 |
| 2020/0035678 A1* | 1/2020 | Lee | H01L 29/775 |
| 2020/0144255 A1* | 5/2020 | Lee | H01L 29/66772 |
| 2020/0294865 A1* | 9/2020 | Cheng | H01L 27/0924 |
| 2020/0312844 A1* | 10/2020 | Jeon | H01L 29/78696 |
| 2021/0134794 A1* | 5/2021 | Huang | H01L 29/42392 |
| 2021/0134950 A1* | 5/2021 | Hsu | H01L 21/31111 |
| 2021/0202709 A1* | 7/2021 | Lee | H01L 29/4966 |
| 2021/0265496 A1* | 8/2021 | Chu | H01L 29/0673 |
| 2022/0278197 A1* | 9/2022 | Wang | H01L 21/02603 |
| 2022/0293731 A1* | 9/2022 | Lee | H01L 29/78696 |
| 2022/0320284 A1* | 10/2022 | Chen | H01L 21/823431 |
| 2022/0344354 A1* | 10/2022 | Lin | H01L 29/66439 |
| 2022/0351976 A1* | 11/2022 | Lee | H01L 29/66742 |
| 2022/0352035 A1* | 11/2022 | Wang | H01L 29/66795 |
| 2023/0065195 A1* | 3/2023 | Hung | H01L 29/0649 |
| 2024/0096880 A1* | 3/2024 | Huang | H01L 29/66545 |

* cited by examiner

METAL GATES FOR MULTI-GATE DEVICES AND FABRICATION METHODS THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Recently, multi-gate devices have been introduced in an effort to improve gate control by increasing gate-channel coupling, reduce OFF-state current, and reduce short-channel effects (SCEs). One such multi-gate device that has been introduced is the gate-all-around transistor (GAA). The GAA device gets its name from the gate structure which can extend around the channel region providing access to the channel on two or four sides. GAA devices are compatible with conventional complementary metal-oxide-semiconductor (CMOS) processes and their structure allows them to be aggressively scaled while maintaining gate control and mitigating SCEs. In conventional processes, GAA devices provide a channel in a stacked nanostructure (e.g., nanosheet or nanowire) configuration. Integration of fabricating the GAA features around stacked nanostructures can be challenging. For example, as device feature sizes continue to decrease, portions of a work function (WF) layer wrapping adjacent stacked nanostructures may connect, filling up spacing therebetween. Therefore, a nanostructure "sees" a thicker WF layer on its top and bottom surfaces than on its sidewall surfaces. Such nonuniformity in turn causes threshold voltage (Vt) fluctuation at different portions of a nanostructure and degrades device performance. Therefore, while processes for multi-gate device formation have generally been adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
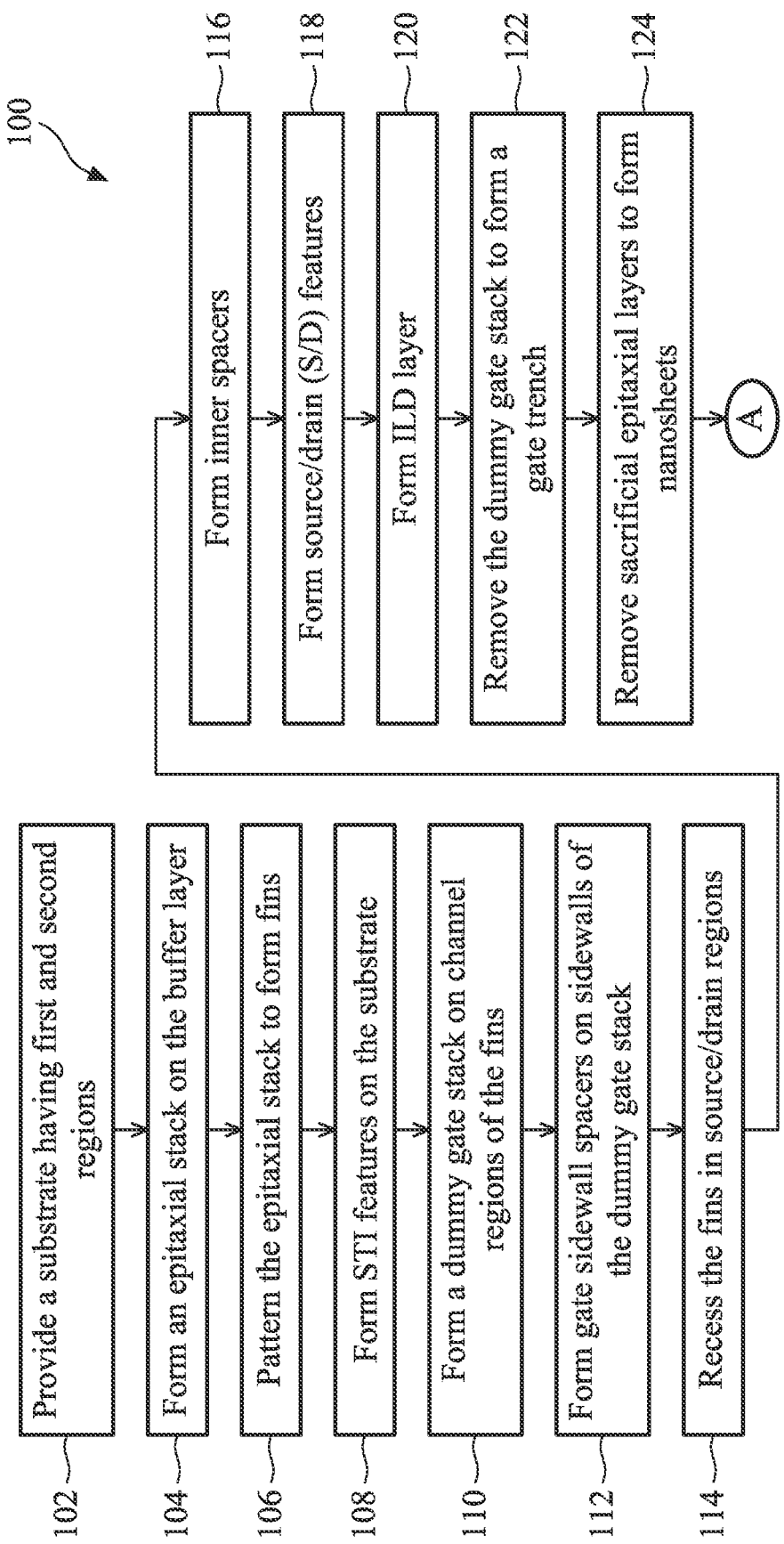
FIGS. 1A and 1B illustrate a flowchart of an example method for making a semiconductor device in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to multi-gate transistors. Multi-gate transistors include those transistors whose gate structures are formed on at least two-sides of a channel region. These multi-gate devices may include an n-type metal-oxide-semiconductor device or a p-type metal-oxide-semiconductor multi-gate device. Specific examples herein may be presented and referred to herein as a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), bar-shaped channel(s), and/or other suitable channel configuration. Presented herein are embodiments of devices that may have one or more channel regions (e.g., nanosheets) associated with a single, contiguous gate structure. However, one of ordinary skill would recognize that the teaching can apply to a single channel or any number of channels, such as a FinFET device, on account of its fin-like structure. One of ordinary skill may recognize other examples of semiconductor devices that may benefit from aspects of the present disclosure.

For advanced technology of semiconductor devices, uniformity of threshold voltages (Vt) among channel regions becomes more and more important. A work function (WF) layer covering or wrapping channel regions is used to define work function for multi-gate transistors. Therefore, uniformity of a WF layer's thickness is as important as its material compositions for accurately defining a work function. However, with transistor dimensions are continually scaled down to sub-10 nm technology nodes and below, spacing (or gaps) between adjacent stacked nanostructures (e.g., nanosheet or nanowires) is decreasing in a GAA process flow, which causes portions of a WF layer wrapping respective adjacent nanostructures connect with each other and fill up the spacing. As a result, portions of the WF layer covering top and bottom surfaces of a nanostructure become thicker than other portions covering sidewall surfaces. Such thickness nonuniformity may cause different regions of a nanostructure to turn on under different voltages and lead to Vt voltage fluctuation. The present disclosure addresses the above problem by providing an improved method of forming a WF isolation layer after a WF layer is formed. The WF isolation layer fills the gaps between adjacent nanostructures and wraps each nanostructure and the respective portion of WF layer wrapping it, thus separates portions of the WF layer wrapping adjacent nanostructures from connecting each other. The proposed method avoids thickness nonuniformity of a WF layer—particularly avoids a thicker portion stacked between adjacent nanostructures—and improves device performance.

Figure 1B:
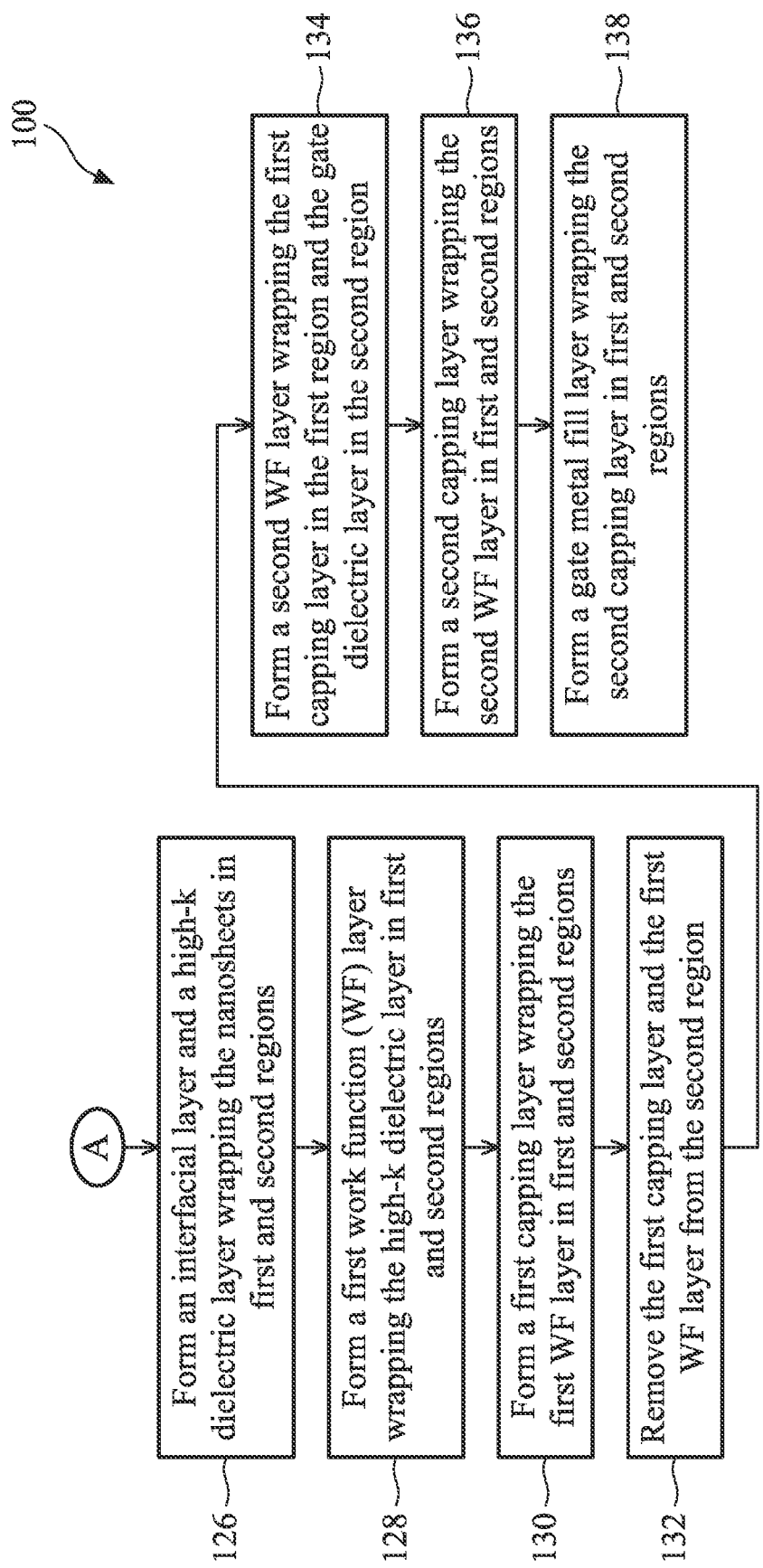

FIGS. 1A and 1B illustrate a flow chart of a method 100 for forming multi-gate devices according to various aspects of the present disclosure. As used herein, the term "multi-gate device" is used to describe a device (e.g., a semiconductor transistor) that has at least some gate material disposed on multiple sides of at least one channel of the device. In some examples, the multi-gate device may be referred to as a GAA device having gate material disposed on four sides of at least one channel member of the device. The channel member may be referred to as "nano structure" or "nanosheet," which is used herein to designate any material portion with nanoscale, or even microscale dimensions, and having an elongate shape, regardless of the cross-sectional shape of this portion. Thus, the term "nanostructure" or "nanosheet" as used herein designates both circular and substantially circular cross-section elongate material portions, and beam or bar-shaped material portions including for example a cylindrical in shape or substantially rectangular cross-section.

FIGS. 1A and 1B will be described below in conjunction with FIGS. 2-26. FIGS. 2-5 are fragmentary cross-sectional views of a semiconductor device 200 at various stages of fabrication according to the method 100. FIG. 6 is a diagrammatic perspective view of a semiconductor device 200 at an intermediate stage of fabrication according to the method 100. FIGS. 7-15 are fragmentary cross-sectional views of an n-type FET (along the A-A line) of the semiconductor device 200 in FIG. 6 at various other stages of fabrication according to the method 100. FIGS. 16-26 are fragmentary cross-sectional views of an n-type FET and a p-type FET (along the B-B line) of the semiconductor device 200 in FIG. 6 at various other stages of fabrication according to the method 100. The method 100 is merely an example, and is not intended to limit the present disclosure beyond what is explicitly recited in the claims. Additional steps can be provided before, during, and after the method 100, and some of the steps described can be moved, replaced, or eliminated for additional embodiments of the method 100. Additional features can be added in the semiconductor device depicted in FIGS. 2-26 and some of the features described below can be replaced, modified, or eliminated in other embodiments of the semiconductor device.

As with the other method embodiments and exemplary devices discussed herein, it is understood that parts of the semiconductor device 200 may be fabricated by a CMOS technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the exemplary devices include a plurality of semiconductor devices (e.g., transistors), including PFETs, NFETs, etc., which may be interconnected. Moreover, it is noted that the process steps of method 100, including any descriptions given with reference to FIGS. 2-24, as with the remainder of the method and exemplary figures provided in this disclosure, are merely exemplary and are not intended to be limiting beyond what is specifically recited in the claims that follow.

Figure 2:
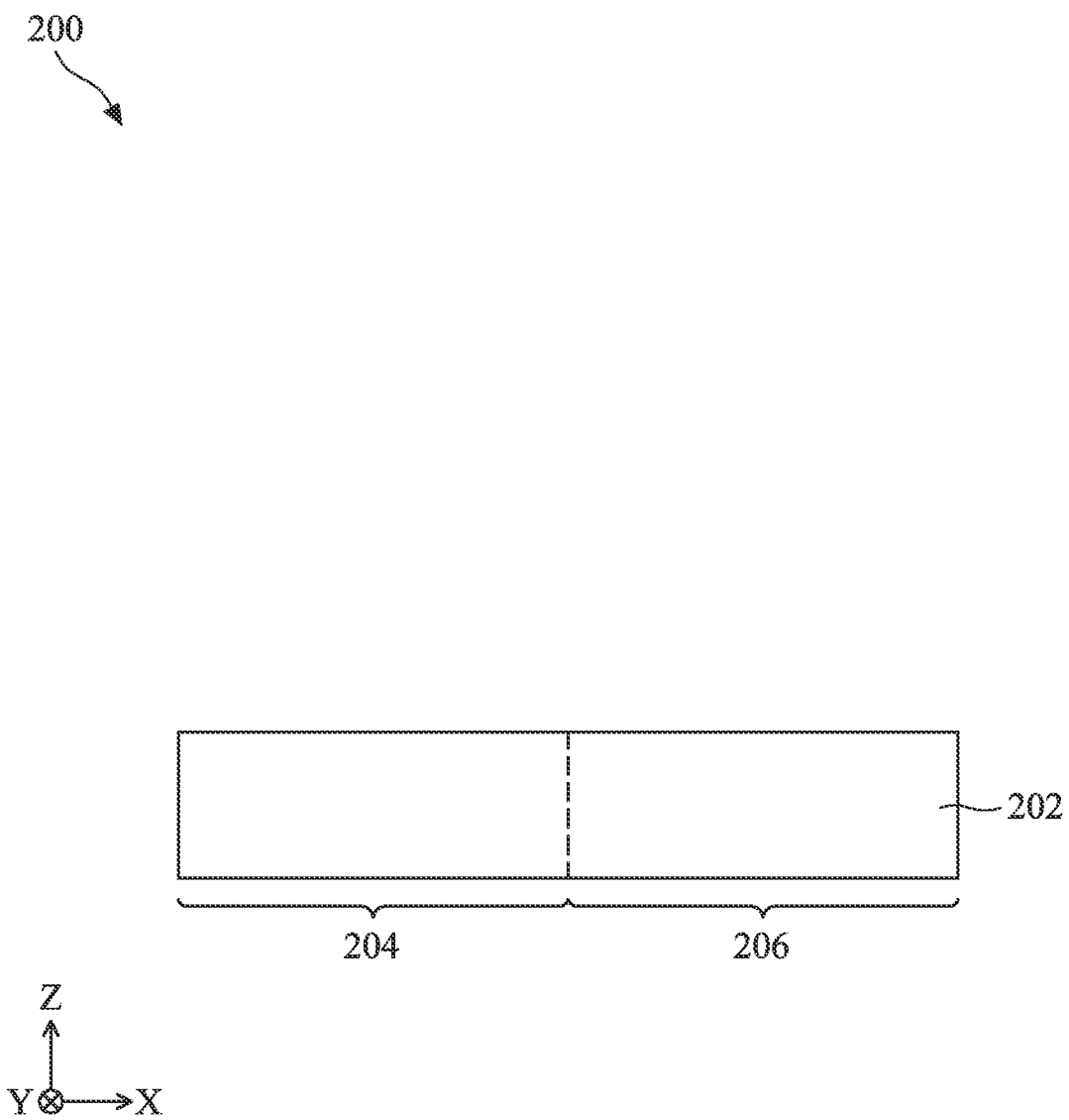
FIGS. 2, 3, 4, and 5 are fragmentary cross-sectional views of an example semiconductor device in accordance with some embodiments of the present disclosure.

At operation 102, the method 100 (FIG. 1A) provides a substrate 202, as shown in FIG. 2. In some embodiments, the substrate 202 may be a semiconductor substrate such as a silicon (Si) substrate. In some embodiments, the substrate 202 includes a single crystalline semiconductor layer on at least its surface portion. The substrate 202 may comprise a single crystalline semiconductor material such as, but not limited to Si, Ge, SiGe, GaAs, InSb, GaP, GaSb, InAlAs, InGaAs, GaSbP, GaAsSb and InP. Alternatively, the substrate 202 may include a compound semiconductor and/or an alloy semiconductor. The substrate 202 may include various layers, including conductive or insulating layers formed on a semiconductor substrate. The substrate 202 is separated into regions 204 and 206 by an imaginary dotted line in FIG. 2. In some embodiments, two or more transistors are formed in and/or over the regions 204 and 206 of the substrate 202. In some embodiments, an n-type field effect transistors (NFET) and a p-type field effect transistors (PFET) will be formed in and/or over the regions 204 and 206, respectively. Thus, the region 204 is also referred to as the NFET region 204 and the region 206 is also referred to as the PFET region 206 in the present disclosure. The regions 204 and 206 may include various doping configurations depending on design requirements as is known in the art. For example, different doping profiles (e.g., a p-well in the region 204 and an n-well in the region 206) may be formed in the respective regions designed for different device types (e.g., NFETs or PFETs). The suitable doping may include ion implantation of dopants and/or diffusion processes, such as boron (B) for forming a p-well in the region 204 and phosphorous (P) for forming an n-well in the region 206.

Figure 3:
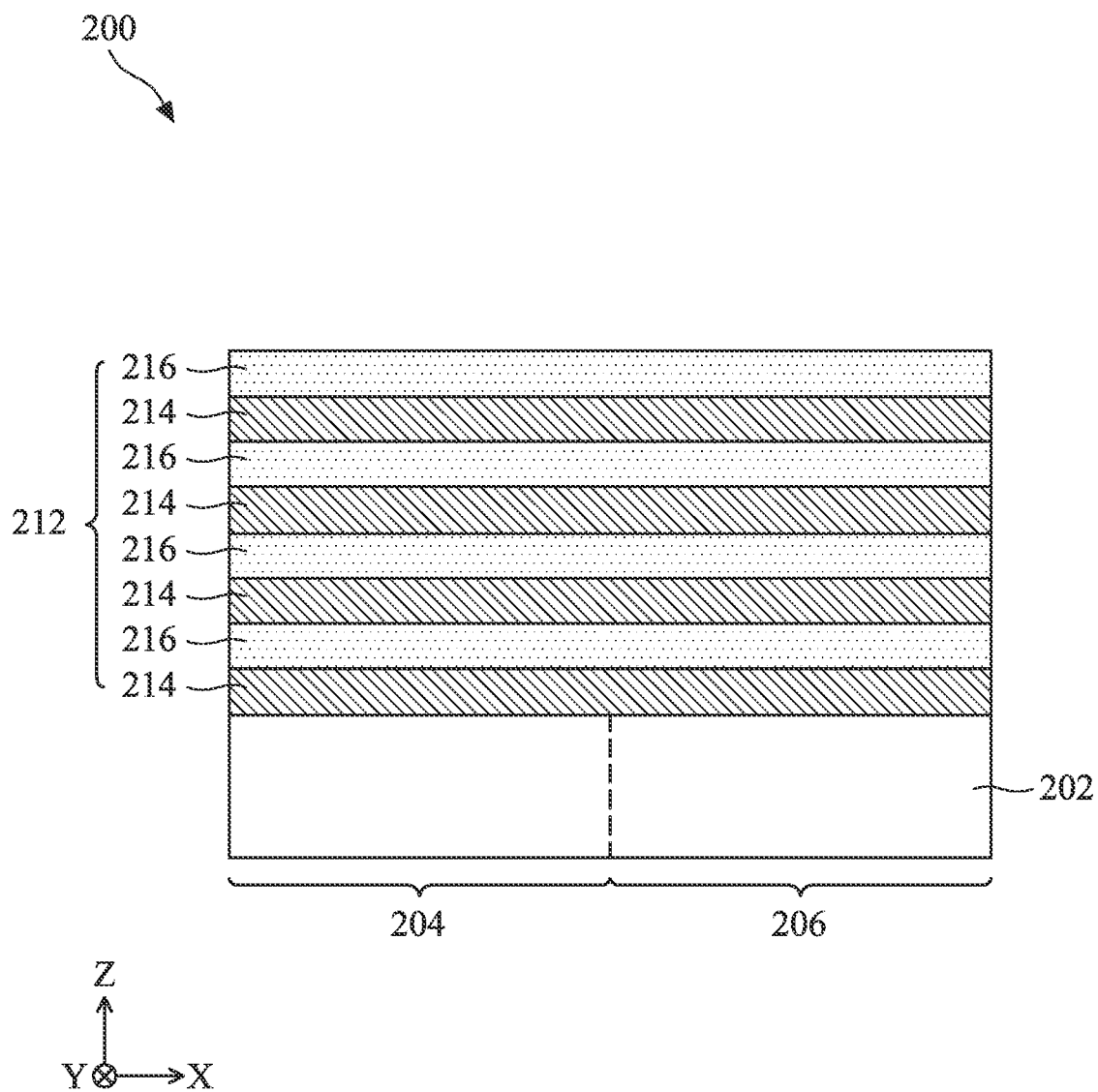

At operation 104, the method 100 (FIG. 1A) forms one or more epitaxial layers over the substrate 202, as shown in FIG. 3. In some embodiments, an epitaxial stack 212 is formed over the regions 204 and 206. The epitaxial stack 212 includes epitaxial layers 214 of a first composition interposed by epitaxial layers 216 of a second composition. The first and second composition can be different. In an embodiment, the epitaxial layers 214 are SiGe and the epitaxial layers 216 are silicon. However, other embodiments are possible including those that provide for a first composition and a second composition having different oxidation rates and/or etch selectivity. In some embodiments, the epitaxial layer 214 includes SiGe and where the epitaxial layer 216 includes silicon, the silicon oxidation rate is less than the SiGe oxidation rate. It is noted that four (4) layers of each of epitaxial layers 214 and 216 are illustrated in FIG. 3, which is for illustrative purposes only and not intended to be limiting beyond what is specifically recited in the claims. It can be appreciated that any number of epitaxial layers can be formed in the epitaxial stack 212; the number of layers depending on the desired number of channel regions for the device 200. In some embodiments, the number of epitaxial layers 216 is between 2 and 10, such as 4 or 5.

In some embodiments, the epitaxial layer 214 has a thickness ranging from about 4 nm to about 12 nm. The epitaxial layers 214 may be substantially uniform in thickness. In some embodiments, the epitaxial layer 216 has a thickness ranging from about 3 nm to about 6 nm. In some embodiments, the epitaxial layers 216 of the stack are substantially uniform in thickness. As described in more detail below, the epitaxial layer 216 may serve as channel region(s) for a subsequently-formed multi-gate device and its thickness is chosen based on device performance considerations. The epitaxial layer 214 may serve to reserve a spacing (or referred to as a gap) between adjacent channel region(s) for a subsequently-formed multi-gate device and its thickness is chosen based on device performance considerations.

By way of example, epitaxial growth of the epitaxial stack 212 may be performed by a molecular beam epitaxy (MBE) process, a metalorganic chemical vapor deposition (MOCVD) process, and/or other suitable epitaxial growth processes. In some embodiments, the epitaxially grown layers, such as the layers 216, include the same material as the substrate 202, such as silicon (Si). In some embodiments, the epitaxially grown layers 214 and 216 include a different material than the substrate 202. As stated above, in at least some examples, the epitaxial layer 214 includes an epitaxially grown $Si_{1-x}Ge_x$ layer (e.g., x is about 25~55%) and the epitaxial layer 216 includes an epitaxially grown Si layer. Alternatively, in some embodiments, either of the epitaxial layers 214 and 216 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 214 and 216 may be chosen based on providing differing oxidation and etch selectivity properties. In various embodiments, the epitaxial layers 214 and 216 are substantially dopant-free (i.e., having an extrinsic dopant concentration from about 0 $cm^{-3}$ to about $1 \times 10^{17}$ $cm^{-3}$), where for example, no intentional doping is performed during the epitaxial growth process.

Figure 4:
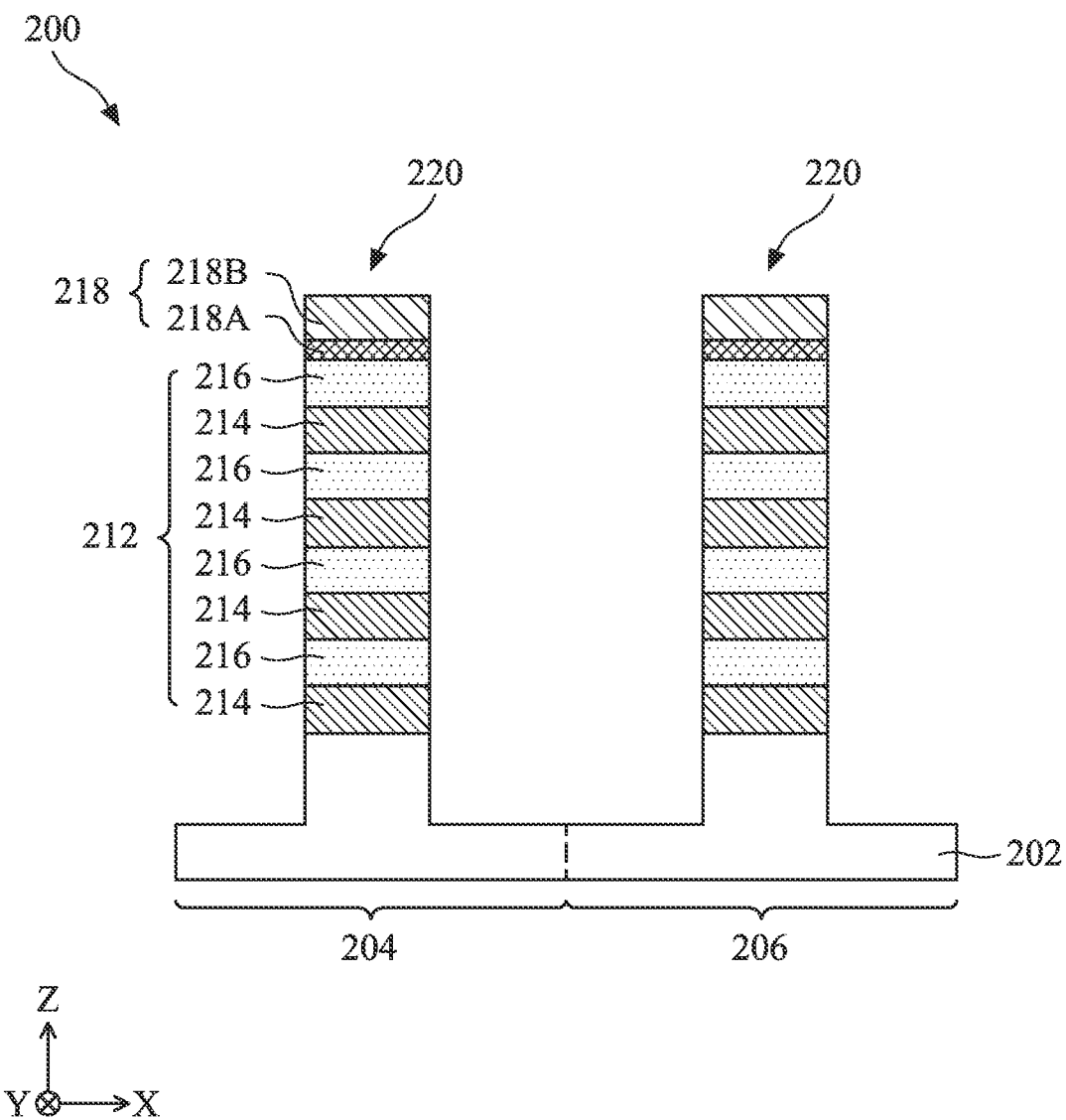

At operation 106, the method 100 (FIG. 1A) patterns the epitaxial stack 212 to form semiconductor fins 220 (also referred to as fins 220), as shown in FIG. 4. In the illustrated embodiment, a top portion of the substrate 202 is also patterned. In various embodiments, each of the fins 220 includes an upper portion of the interleaved epitaxial layers 214 and 216 and a bottom portion protruding from the substrate 202. In some embodiments, operation 106 includes forming a mask layer 218 over the epitaxial stack 212. The mask layer 218 includes a first mask layer 218A and a second mask layer 218B. In some embodiments, the first mask layer 218A is a pad oxide layer made of a silicon oxide, which can be formed by a thermal oxidation; the second mask layer 218B is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 218 is patterned into a mask pattern by using patterning operations including photo-lithography and etching.

In some embodiments, operation 106 patterns the epitaxial stack 212 using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the epitaxial stack 212 in an etching process, such as a dry etch (e.g., reactive ion etching), a wet etch, and/or other suitable process, through openings defined in the patterned mask layer 218. The stacked epitaxial layers 214 and 216 are thereby patterned into fins 220 with trenches between adjacent fins. Each of the fins 220 protrudes upwardly in the z-direction from the substrate 202 and extends lengthwise in the y-direction. In FIG. 3, two (2) fins 220 are spaced apart along the x-direction with one fin disposed above the NFET region 204 and one fin disposed above the PFET region 206. But the number of the fins is not limited to two, and may be as small as one or more than two.

Figure 5:
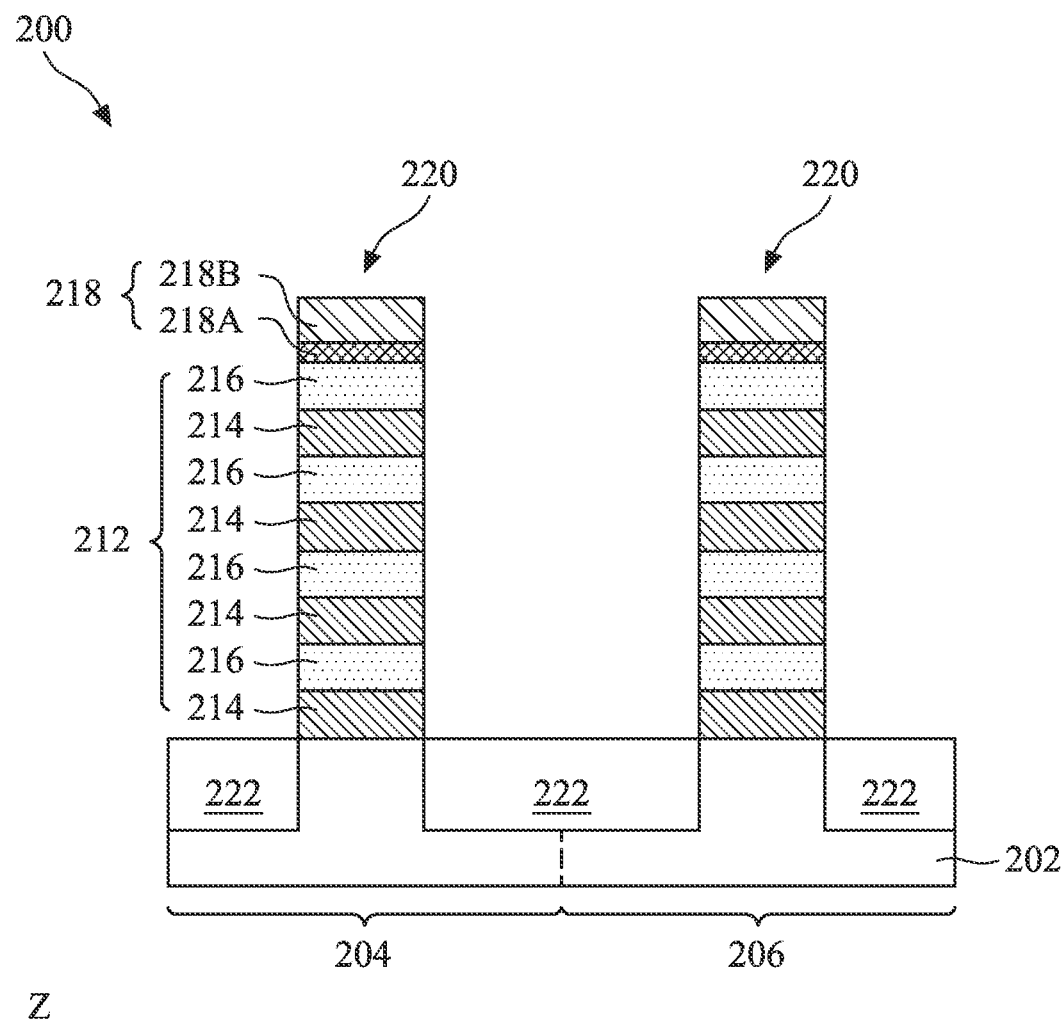
Figure 6:
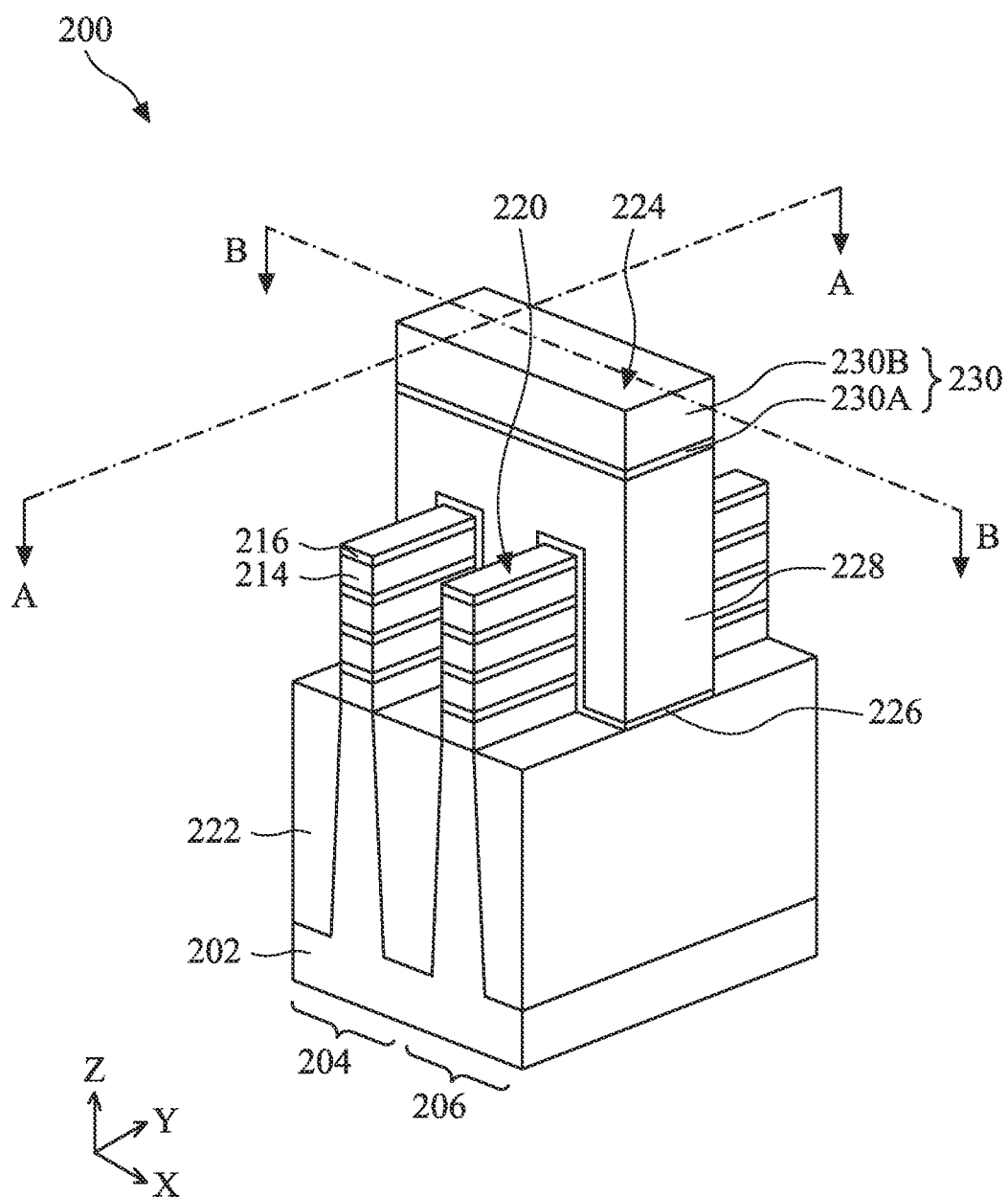
FIG. 6 illustrates a three-dimensional perspective view of an example semiconductor device in accordance with some embodiments of the present disclosure.

At operation 108, the method 100 (FIG. 1A) fills the trenches between adjacent fins 220 with a dielectric material to form an isolation feature 222, as shown in FIG. 5. The isolation feature 222 may include one or more dielectric layers. Suitable dielectric materials for the isolation feature 222 may include silicon oxides, silicon nitrides, silicon carbides, fluorosilicate glass (FSG), low-K dielectric materials, and/or other suitable dielectric materials. The dielectric material may be deposited by any suitable technique including thermal growth, CVD, HDP-CVD, PVD, ALD, and/or spin-on techniques. Operation 108 subsequently recesses the isolation features 222 to form shallow trench isolation (STI) features (also denoted as STI features 222). In the illustrated embodiment, the STI features 222 are disposed on sidewalls of the protruding portion of the substrate 202. A top surface of the STI feature 222 may be coplanar with a bottom surface of the epitaxial stack 212 or lower than the bottom surface of the epitaxial stack 212 for about 1 nm to about 10 nm. Any suitable etching technique may be used to recess the isolation features 222 including dry etching, wet etching, RIE, and/or other etching methods, and in an exemplary embodiment, an anisotropic dry etching is used to selectively remove the dielectric material of the isolation features 222 without etching the fins 220. The mask layer 218 may also be removed before, during, and/or after the recessing of the isolation features 222. In some embodiments, the mask layer 218 is removed by a CMP process performed prior to the recessing of the isolation features 222. In some embodiments, the mask layer 218 is removed by an etchant used to recess the isolation features 222.

At operation 110, the method 100 (FIG. 1A) forms a sacrificial (dummy) gate structure (or gate stack) 224, as shown in FIG. 6. The sacrificial gate structure 224 is formed over portions of the fins 220 which is to be channel regions. The sacrificial gate structure 224 defines the channel regions of the GAA devices. The sacrificial gate structure 224 includes a sacrificial gate dielectric layer 226 and a sacrificial gate electrode layer 228. The sacrificial gate structure 224 is formed by first blanket depositing the sacrificial gate dielectric layer 226 over the fins 220. A sacrificial gate electrode layer 228 is then blanket deposited on the sacrificial gate dielectric layer 226 and over the fins 220. The sacrificial gate electrode layer 228 includes silicon such as polycrystalline silicon or amorphous silicon. The thickness of the sacrificial gate dielectric layer is in a range from about 1 nm to about 5 nm in some embodiments. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer 226 and the sacrificial gate electrode layer 228 are deposited using CVD, including LPCVD and PECVD, PVD, ALD, or other suitable process. Subsequently, a mask layer 230 is formed over the sacrificial gate electrode layer. The mask layer 230 may include a pad silicon oxide layer 230A and a silicon nitride mask layer 230B. Subsequently, a patterning operation is performed on the mask layer 230 and sacrificial gate dielectric and electrode layers are patterned into the sacrificial gate structure 224. By patterning the sacrificial gate structure 224, the fins 220 are partially exposed on opposite sides of the sacrificial gate structure 224, thereby defining source/drain (S/D) regions. In this disclosure, a source and a drain are interchangeably used and the structures thereof are substantially the same.

Figure 7:
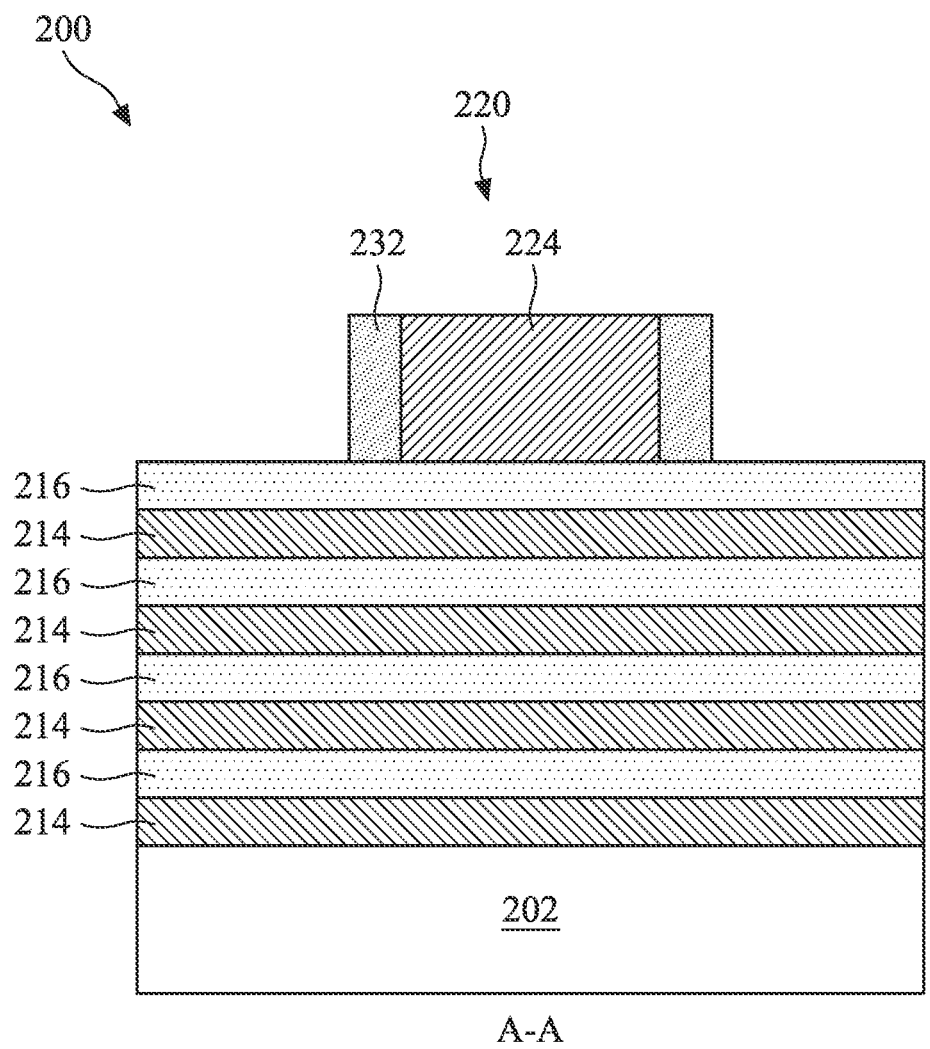
FIGS. 7, 8, 9, 10, 11, 12, 13, 14, and 15 are corresponding fragmentary cross-sectional views of a semiconductor device in FIG. 6 taken along a first cut A-A at intermediate stages of an embodiment of the method of FIGS. 1A and 1B in accordance with some embodiments of the present disclosure.
Figure 7:
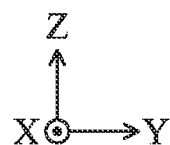

At operation 112, the method 100 (FIG. 1A) forms gate sidewall spacers 232 on sidewalls of the sacrificial gate structure 224, as shown in FIG. 7 which is a cross-sectional view along the lengthwise direction of the fin 220 above the NFET region 204 (A-A line) in FIG. 6. The cross-sectional view along the lengthwise direction of another fin 220 above the PFET region 206 is similar to what is illustrated in FIG. 7 and omitted herein for the sake of simplicity. The gate sidewall spacers 232 also cover a portion of the top surfaces of the fin 220. The gate sidewall spacers 232 may include a dielectric material such as silicon oxide, silicon nitride, silicon carbide, silicon oxynitride, SiCN films, silicon oxycarbide, SiOCN films, and/or combinations thereof. In some embodiments, the gate sidewall spacers 232 include multiple layers, such as main spacer walls, liner layers, and the like. By way of example, the gate sidewall spacers 232 may be formed by depositing a dielectric material layer over the sacrificial gate structure 224 using processes such as, a CVD process, a subatmospheric CVD (SACVD) process, a flowable CVD process, an ALD process, a PVD process, or other suitable process. In some embodiments, the deposition of the dielectric material layer is followed by an etching-back (e.g., anisotropically) process to expose portions of the fin 220 adjacent to and not covered by the sacrificial gate structure 224 (e.g., S/D regions). The dielectric material layer may remain on the sidewalls of the sacrificial gate structure 224 as gate sidewall spacers 232. In some embodiments, the etching-back process may include a wet etch process, a dry etch process, a multiple-step etch process, and/or a combination thereof. The gate sidewall spacers 232 may have a thickness ranging from about 5 nm to about 20 nm.

Figure 8:
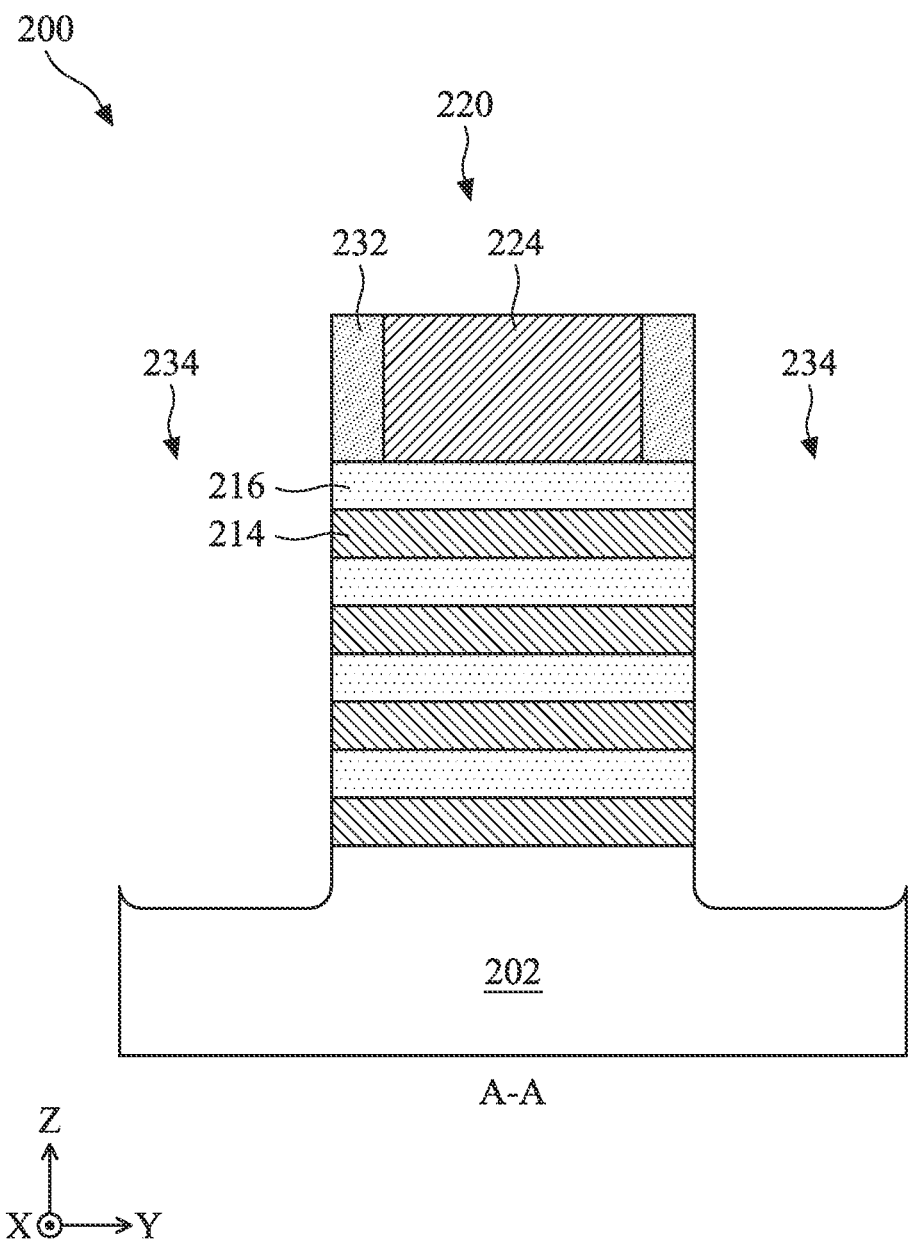

At operation 114, the method 100 (FIG. 1A) recesses a portion of the fin 220 to form recesses 234 in the S/D regions, as shown in FIG. 8 which is a cross-sectional view along A-A line of the device 200 in FIG. 6. The stacked epitaxial layers 214 and 216 are etched down at the S/D regions. In the illustrated embodiment, a top portion of the substrate 202 is also etched. In some embodiments, operation 114 forms the recesses 234 by a suitable etching process, such as a dry etching process, a wet etching process, or an RIE process. The etching process at operation 118 may implement a dry etching process using an etchant including a bromine-containing gas (e.g., HBr and/or CHBR$_3$), a fluorine-containing gas (e.g., CF$_4$, SF$_6$, CH$_2$F$_2$, CHF$_3$, and/or C$_2$F$_6$), other suitable gases, or combinations thereof.

Figure 9:
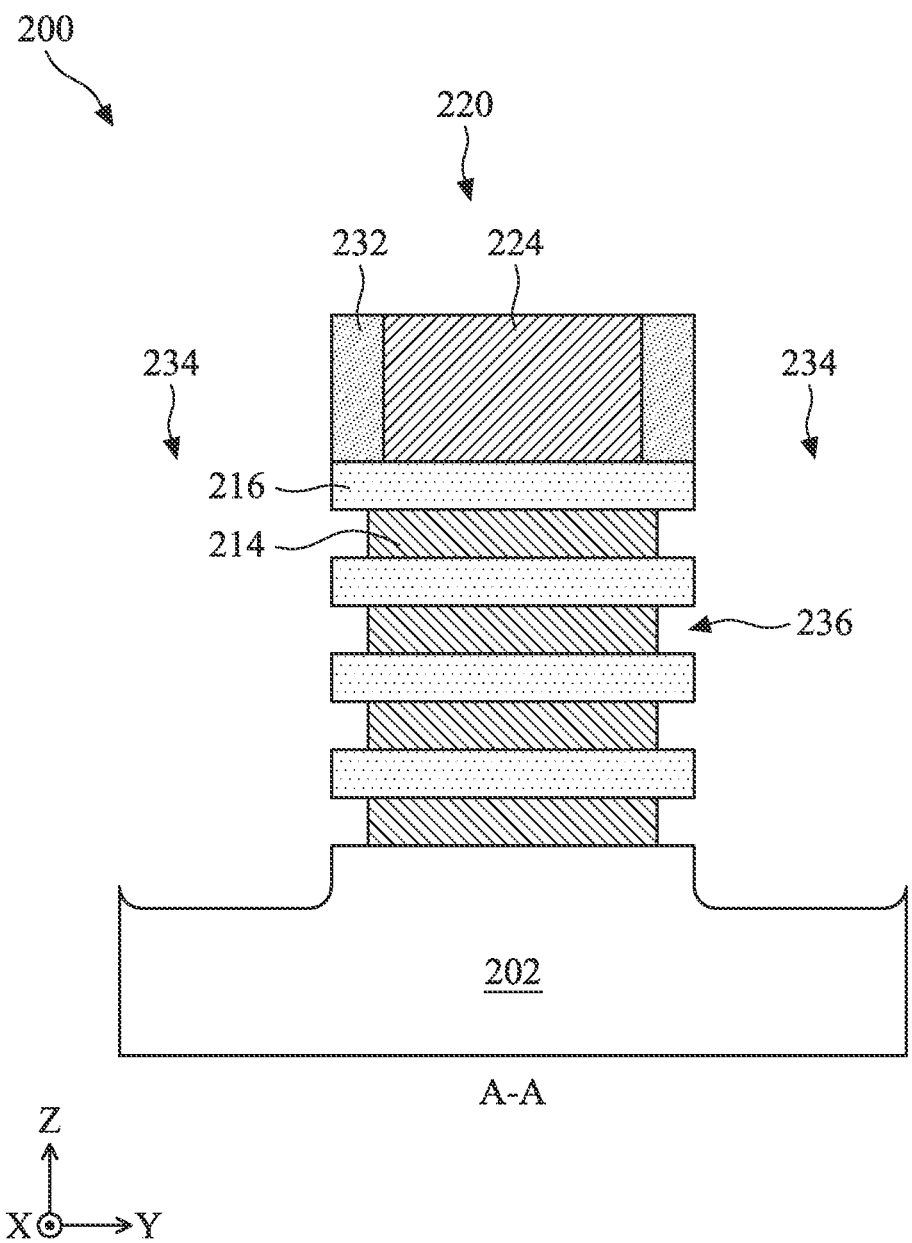

At operation 116, the method 100 (FIG. 1A) forms inner spacers directly under the gate sidewall spacers 232. In some embodiments, operation 116 first laterally etches the epitaxial layers 214 in the y-direction, thereby forming cavities 236, as shown in FIG. 9 which is a cross-sectional view along A-A line of the device 200 in FIG. 6. The amount of etching of the epitaxial layers 214 is in a range from about 1 nm to about 4 nm in some embodiments. The epitaxial layers 214 can be selectively etched by using a wet etchant such as, but not limited to, ammonium hydroxide (NH$_4$OH), tetramethylammonium hydroxide (TMAH), ethylenediamine pyrocatechol (EDP), or potassium hydroxide (KOH) solutions. Alternatively, operation 120 may first selectively oxidize lateral ends of the epitaxial layers 214 that are exposed in the recesses 234 to increase the etch selectivity between the epitaxial layers 214 and 216. In some examples, the oxidation process may be performed by exposing the device 200 to a wet oxidation process, a dry oxidation process, or a combination thereof.

Figure 10:
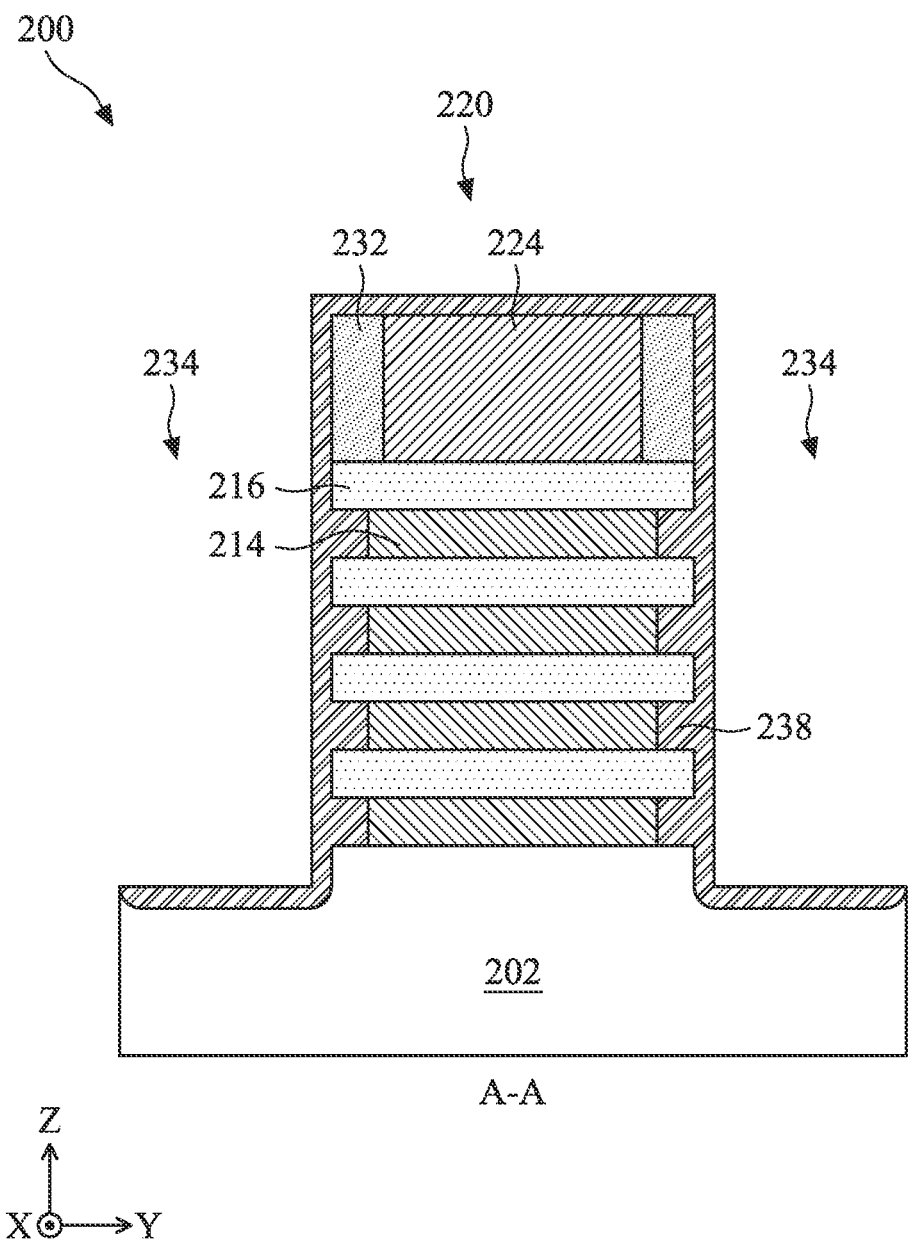

Subsequently, operation 116 forms an inner spacer material layer 238 on the lateral ends of the epitaxial layer 214 and on the epitaxial layers 216 in the recesses 234 and cavities 236, as shown in FIG. 10 which is a cross-sectional view along A-A line of the device 200 in FIG. 6. The inner spacer material layer 238 may include silicon oxides, silicon nitrides, silicon carbides, silicon carbide nitride, silicon oxide carbide, silicon carbide oxynitride, and/or other suitable dielectric materials. In some embodiments, the inner spacer material layer 238 is deposited as a conformal layer. The inner spacer material layer 238 can be formed by ALD or any other suitable method. By conformally forming the inner spacer material layer 238, the size of the cavity 236 is reduced or completely filled.

Figure 11:
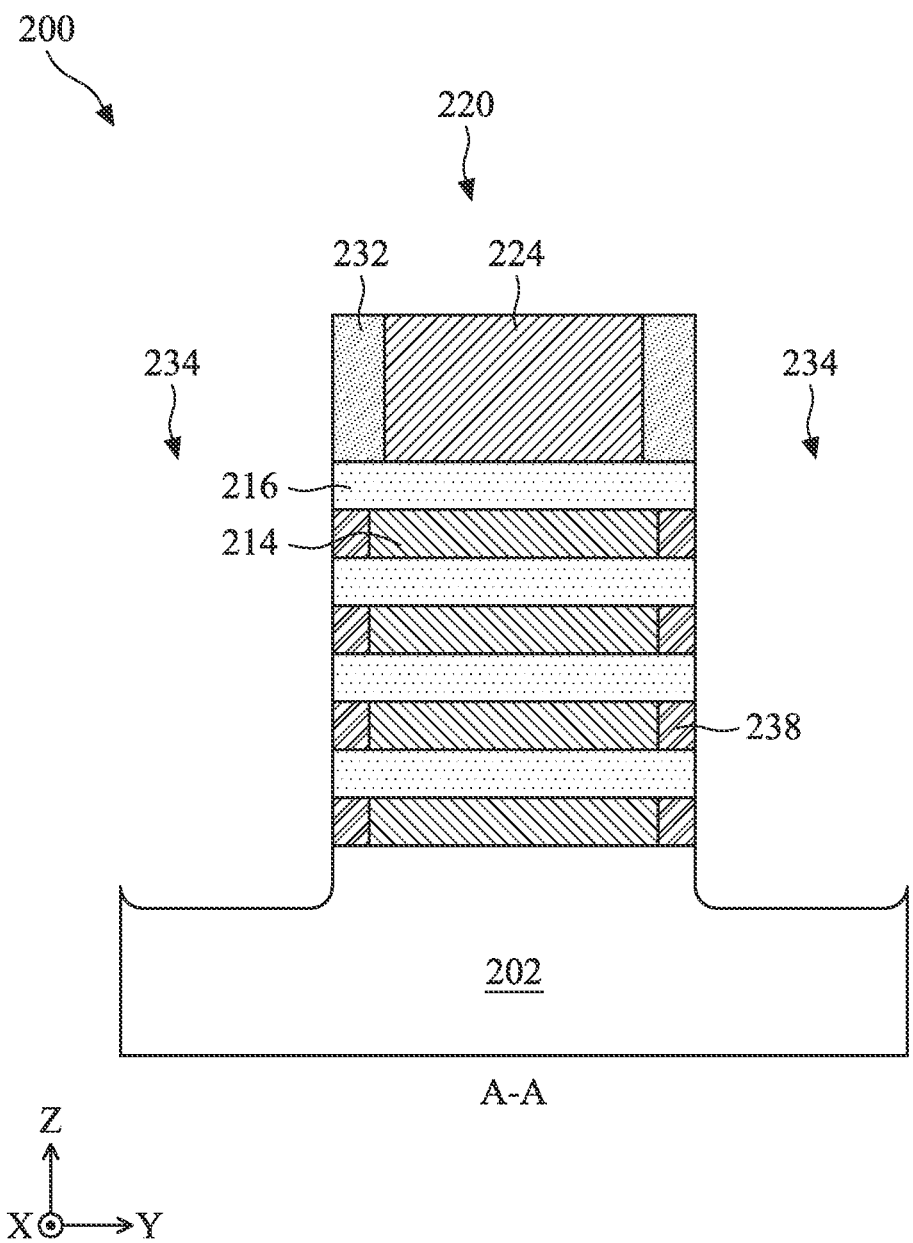

After the inner spacer material layer 238 is formed, an etching operation is performed to partially remove the inner spacer material layer 238, as shown in FIG. 11 which is a cross-sectional view along A-A line of the device 200 in FIG. 6. By this etching, the inner spacer material layer 238 remains substantially within the cavity 236, because of a small volume of the cavity. Generally, plasma dray etching etches a layer in wide and flat areas faster than a layer in concave (e.g., holes, grooves and/or slits) portions. Thus, the inner spacer material layer 238 can remain inside the cavities 236. The remained portions of the inner spacer material layer 238 is denoted as the inner spacers 238.

Figure 12:
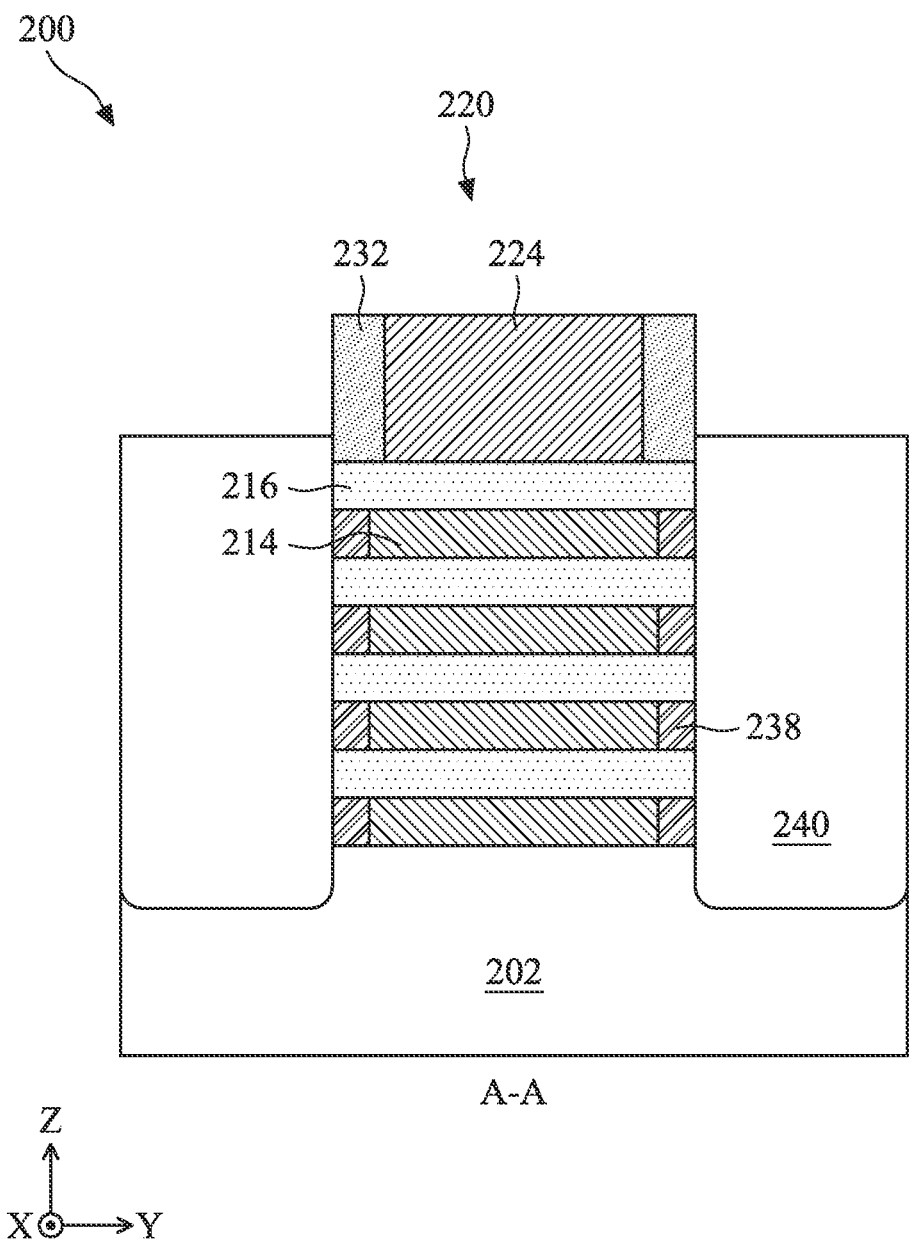

At operation 118, the method 100 (FIG. 1A) forms epitaxial S/D features 240 in recesses 234, as shown in FIG. 12 which is a cross-sectional view along A-A line of the device 200 in FIG. 6. In some embodiments, the epitaxial S/D features 240 include silicon for NFETs and SiGe for PFETs. In some embodiments, the epitaxial S/D features 240 are formed by an epitaxial growth method using CVD, ALD or molecular beam epitaxy (MBE). The epitaxial S/D features 240 are formed in contact with the epitaxial layers 216, and separated from the epitaxial layers 214 by the inner spacers 238. In some embodiment, cavities 236 are not filled by the inner spacer material 238 but be capped by the epitaxial S/D features 240. Therefore, capped cavities 236 are also referred to as "air spacers".

Figure 13:
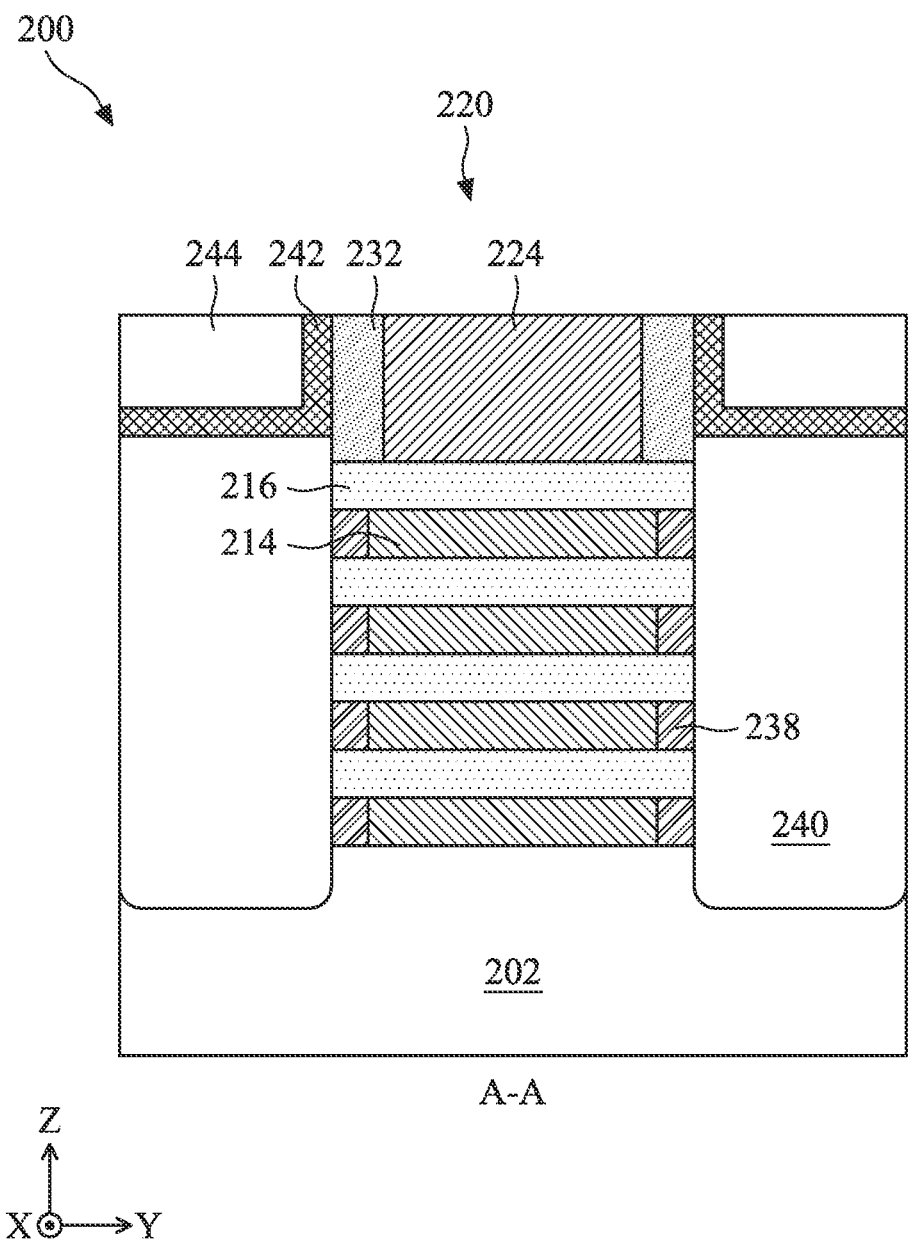

At operation 120, the method 100 (FIG. 1A) forms a contact etch stop layer (CESL) 242 over the epitaxial S/D features 240 and an interlayer dielectric (ILD) layer 244 over the CESL layer 242, as shown in FIG. 13 which is a cross-sectional view along A-A line of the device 200 in FIG. 6. The CESL layer 242 may comprise silicon nitride, silicon oxynitride, silicon nitride with oxygen (O) or carbon (C) elements, and/or other materials; and may be formed by CVD, PVD (physical vapor deposition), ALD, or other suitable methods. The ILD layer 244 may comprise tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 244 may be formed by PECVD, flowable CVD (FCVD), or other suitable methods. In some embodiments, forming the ILD layer 244 further includes performing a CMP process to planarize a top surface of the device 200, such that the top surfaces of the sacrificial gate structure 224 are exposed.

Figure 14:
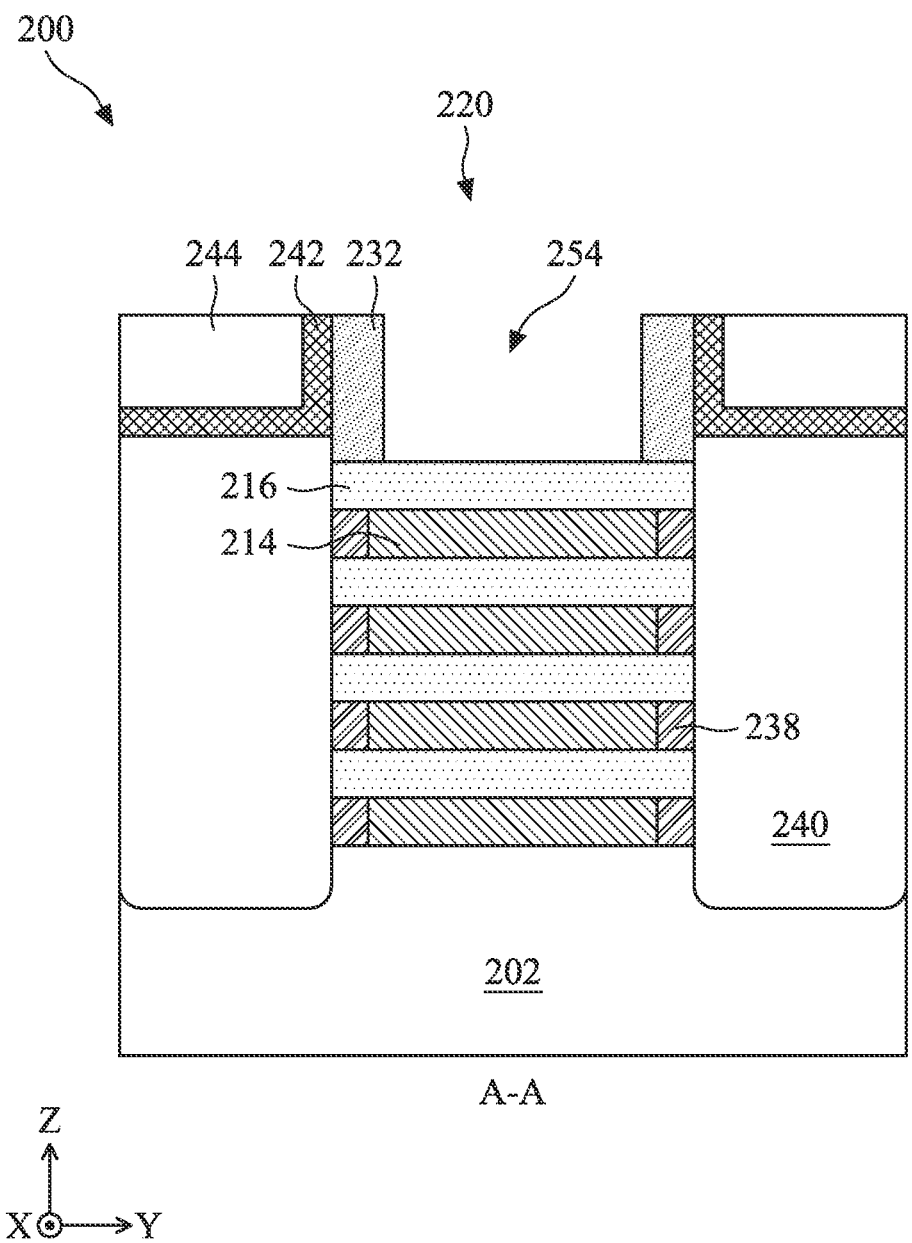

At operation 122, the method 100 (FIG. 1A) removes the sacrificial gate structure 224 to form a gate trench 254, as shown in FIG. 14 which is a cross-sectional view along A-A line of the device 200 in FIG. 6. The gate trench 254 exposes the fin 220 in the channel region(s). The ILD layer 244 and the CESL layer 242 protects the epitaxial S/D features 240 during the removal of the sacrificial gate structure 224. The sacrificial gate structure 224 can be removed using plasma dry etching and/or wet etching. When the sacrificial gate electrode layer is polysilicon and the ILD layer 244 is an oxide, a wet etchant such as a TMAH solution can be used to selectively remove the sacrificial gate electrode layer. The sacrificial gate dielectric layer is thereafter removed using plasma dry etching and/or wet etching.

Figure 15:
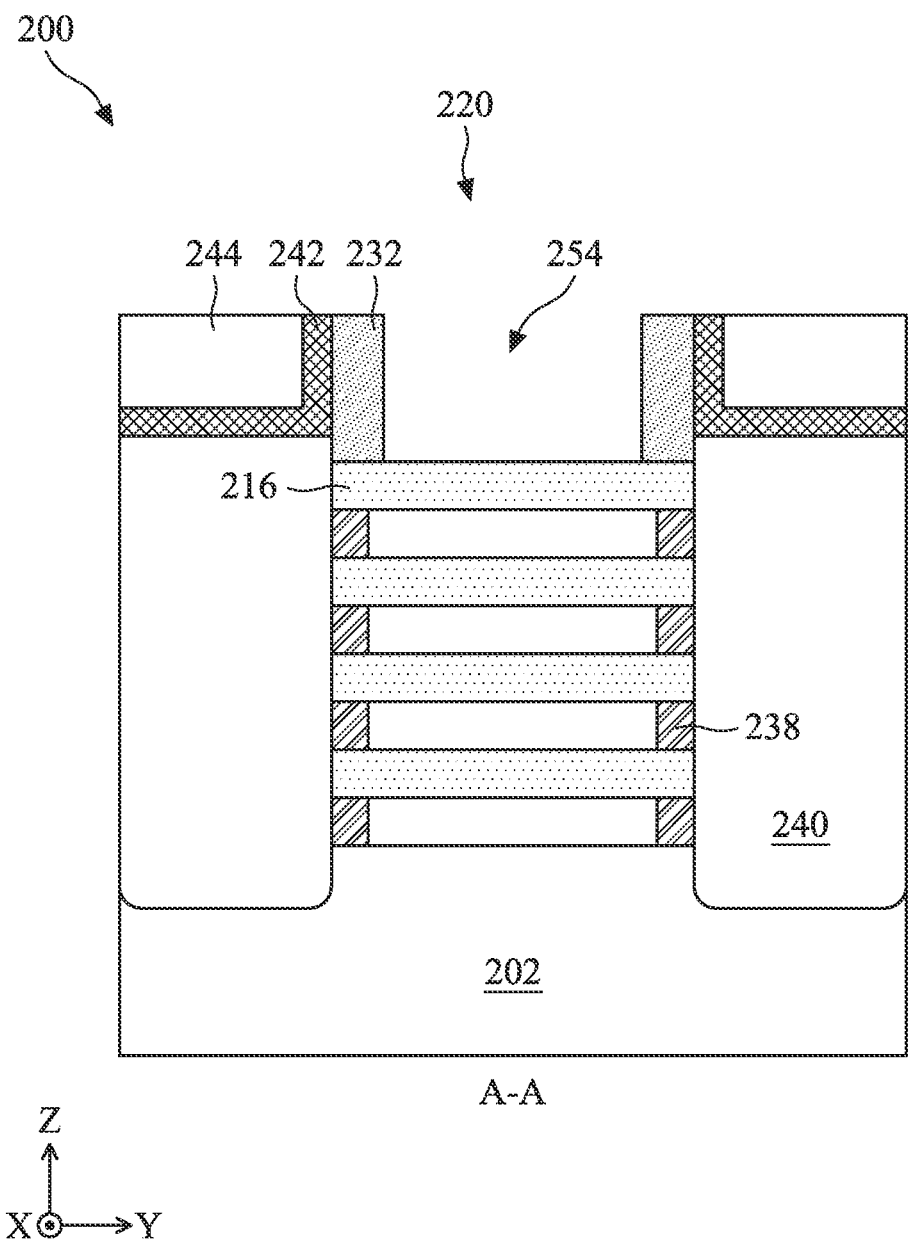
Figure 16:
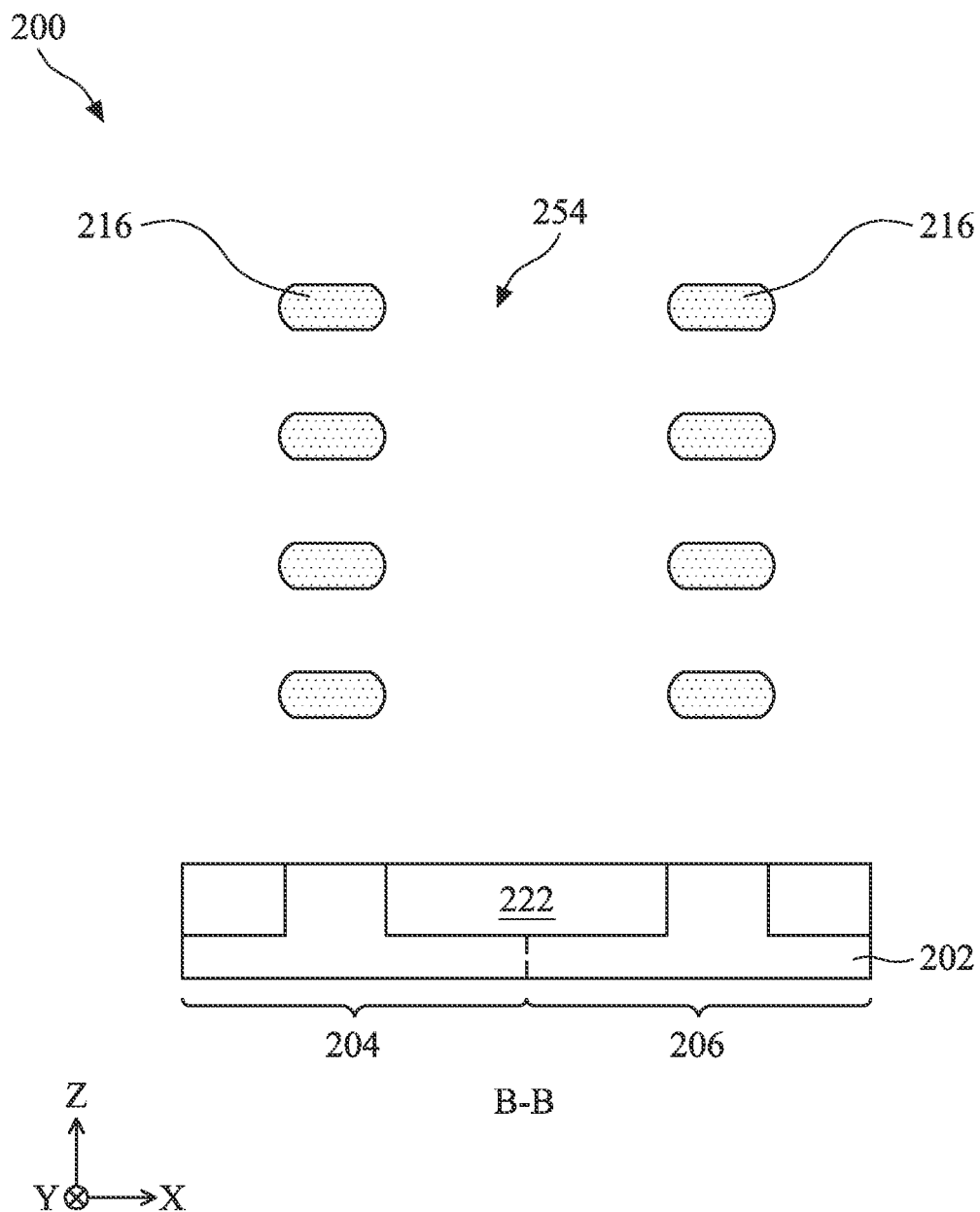
FIGS. 16, 17, 18, 19, 20, 21, 22, 23, 24, and 25 are corresponding fragmentary cross-sectional views of a semiconductor device in FIG. 6 taken along a second cut B-B at intermediate stages of an embodiment of the method of FIGS. 1A and 1B in accordance with some embodiments of the present disclosure.

At operation 124, the method 100 (FIG. 1A) releases channel members from the channel region of the GAA device, as shown in FIG. 15 which is a cross-sectional view along A-A line of the device 200 in FIG. 6. In the illustrated embodiment, channel members are epitaxial layers 216 in the form of nanosheets. In the present embodiment, the epitaxial layers 216 include silicon, and the epitaxial layers 214 include silicon germanium. The plurality of epitaxial layers 214 may be selectively removed. In some implementations, the selectively removal process includes oxidizing the plurality of epitaxial layers 214 using a suitable oxidizer, such as ozone. Thereafter, the oxidized epitaxial layers 214 may be selectively removed from the gate trench 254. To further this embodiment, the operation 124 includes a dry etching process to selectively remove the epitaxial layers 214, for example, by applying an HCl gas at a temperature of about 500 degrees Celsius to about 700 degrees Celsius, or applying a gas mixture of $CF_4$, $SF_6$, and $CHF_3$. For the sake of simplicity and clarity, after operation 124, the epitaxial layers 216 are denoted as nanostructures 216 or nanosheets 216. At this point, two groups of vertically stacked nanosheets 216 are formed above the regions 204 and 206, as shown in FIG. 16 which is a cross-sectional view along B-B line of the device 200 in FIG. 6. In the present embodiment, the nanosheets 216 above the region 204 are suitable for forming an n-type GAA device, and the nanosheets 216 above the region 206 are suitable for forming a p-type GAA device. This configuration is for illustrative purposes only and does not limit the present disclosure.

Figure 17:
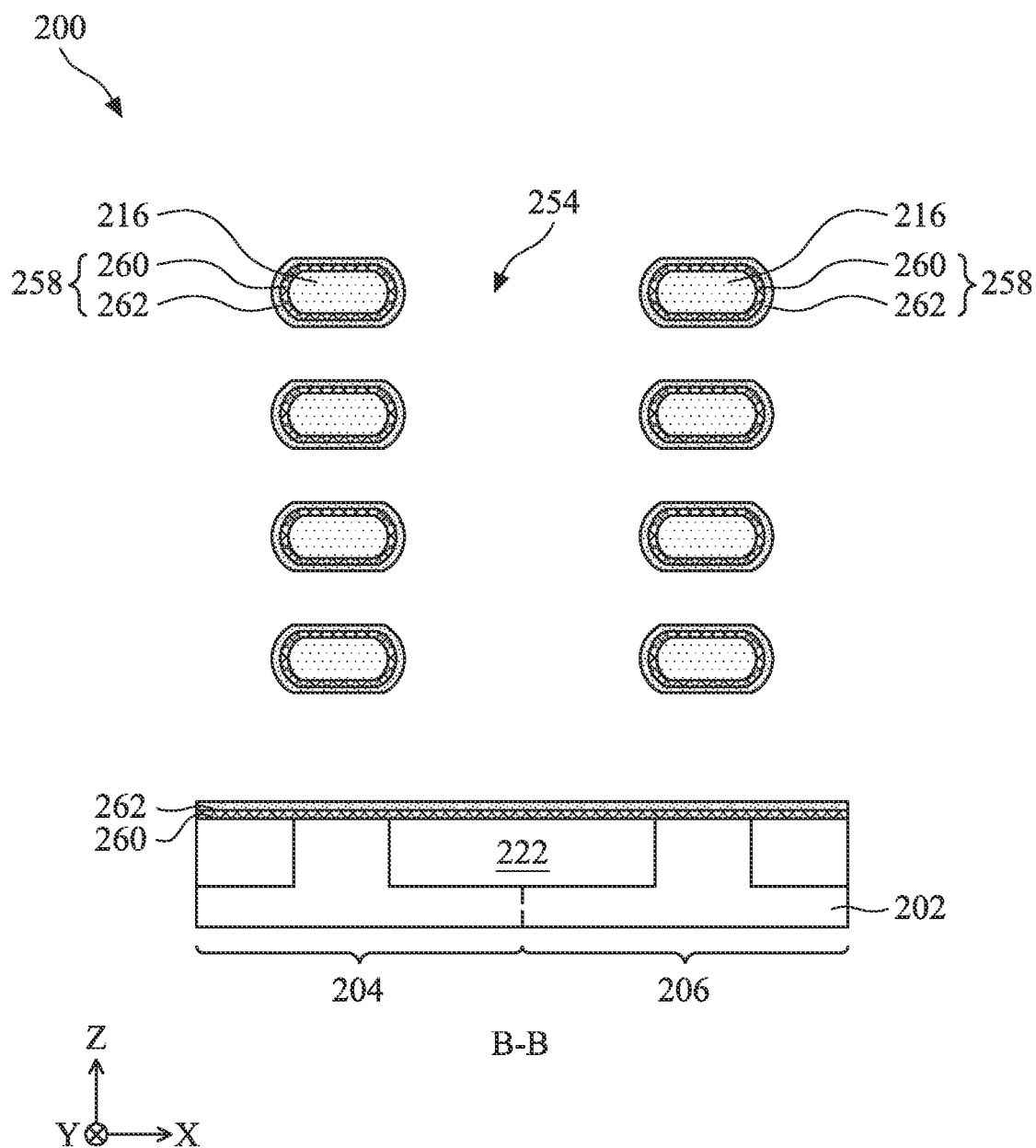

At operation 126, the method 100 (FIG. 1B) forms a gate dielectric layer 258 in the gate trench 254, which includes an interfacial layer 260 and a high-k dielectric layer 262, as shown in FIG. 17 which is a cross-sectional view along B-B line of the device 200 in FIG. 6. The high-k dielectric layer 262 wraps each of the nanosheets 216 in the regions 204 and 206, and the interfacial layer 260 is interposed between the high-k dielectric layer 262 and the nanosheets 216. The interfacial layer 260 may include a dielectric material such as silicon oxide ($SiO_2$) or silicon oxynitride (SiON), and may be formed by chemical oxidation, thermal oxidation, atomic layer deposition (ALD), CVD, and/or other suitable method. The high-k dielectric layer 262 may include hafnium oxide ($HfO_2$), hafnium silicon oxide (HfSiO), hafnium silicon oxynitride (HfSiON), hafnium tantalum oxide (HMO), hafnium titanium oxide (HfTiO), hafnium zirconium oxide (HfZrO), other suitable high-k dielectric materials, and/or combinations thereof. The high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, other suitable materials, and/or combinations thereof. The high-k dielectric layer 262 may be formed by any suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof. In one embodiment, the gate dielectric layer 258 is formed using a highly conformal deposition process such as ALD in order to ensure the formation of a gate dielectric layer having a uniform thickness around each channel layers. The thickness of the gate dielectric layer 258 is in a range from about 1 nm to about 6 nm in some embodiments.

In some embodiments, operation 126 also forms a barrier layer (not shown) in the gate trench 254 wrapping the gate dielectric layer 258 in both regions 204 and 206. The barrier layer is intended to protect the gate dielectric layer 258 from metal impurities introduced in later steps. For example, without the barrier layer, metal materials from subsequently-formed work function layers may diffuse into the gate dielectric layer 258, causing manufacturing defects. In various embodiments, the barrier layer includes a metal element. For example, the barrier layer may include tantalum nitride (TaN). In another example, the barrier layer includes titanium nitride (TiN). In yet another example, the barrier layer includes niobium nitride (NbN). Various other materials are suitable. In an embodiment, the barrier layer is formed by ALD, PVD, CVD, or other suitable methods.

Figure 18:
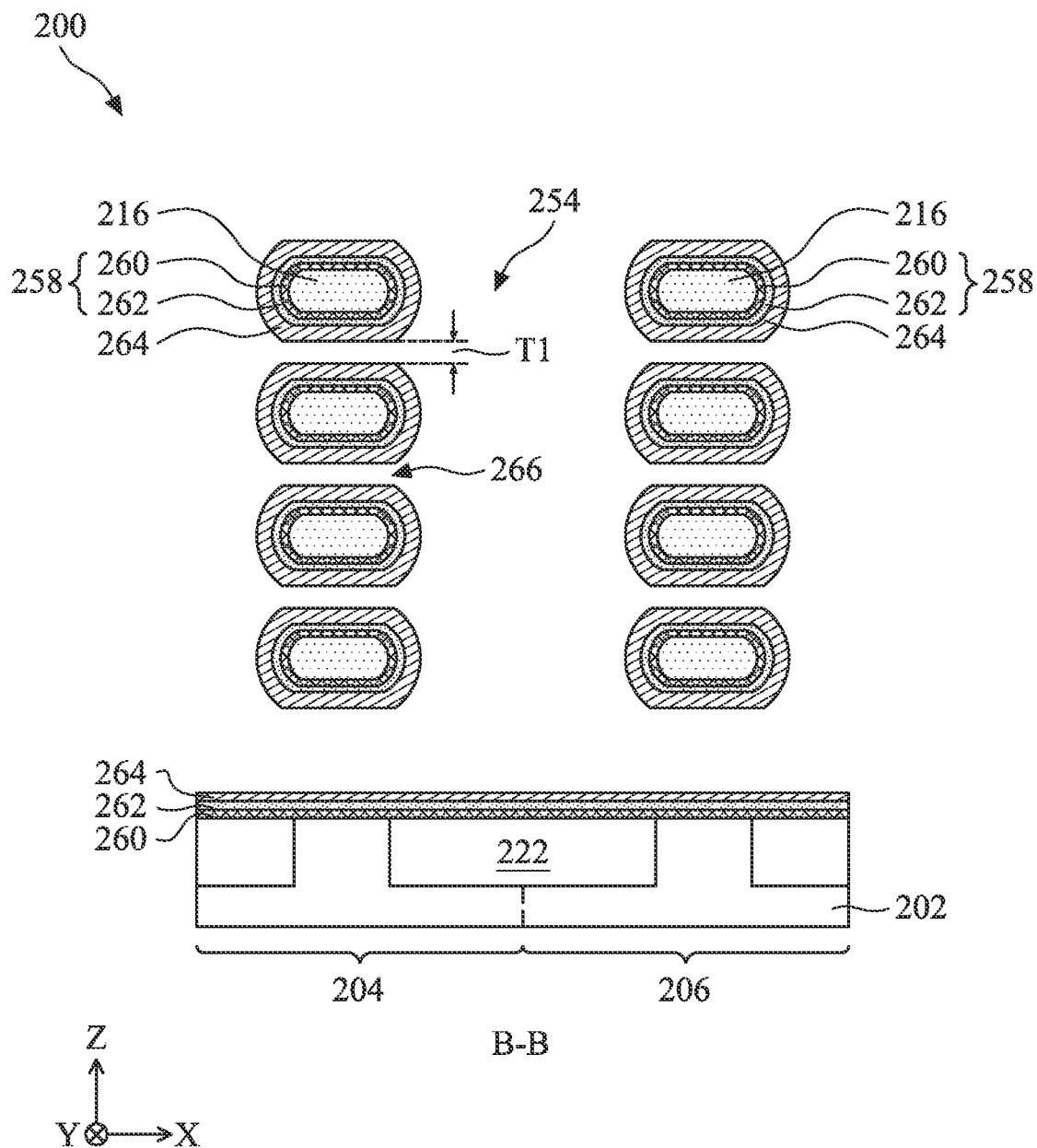

At operation 128, the method 100 (FIG. 1B) forms a first work function (WF) layer 264 wrapping the gate dielectric layer 258 (and barrier layer if formed) in both regions 204 and 206, as shown in FIG. 18 which is a cross-sectional view along B-B line of the device 200 in FIG. 6. The first WF layer 264 may include materials such as metal, metal carbide, metal nitride, or other suitable materials. In the present embodiment, the first WF layer 264 includes an n-type work function material that is suitable for forming an NFET in the NFET region 204. As will be discussed later on, the first WF layer 264 will be removed from the PFET region 206, thereby leaving the n-type work function material in the NFET region 204. In some embodiments, the first WF layer 264 may include materials such as hafnium, zirconium, titanium, tantalum, aluminum, metal carbides, other suitable materials, or the combinations thereof. In one embodiment, the first WF layer 264 includes TiAl. The first WF layer 264 is capable of providing a work function value of about 4.4 eV or less.

In various embodiments, the first WF layer 264 has a thickness of about 1 nm to about 5 nm. The deposition process may include ALD, PVD, CVD, or other suitable methods. After the forming of the first WF layer 264, the spacing 266 between adjacent stacked nanosheets 216 may become quite narrow, such as with a vertical distance (denoted as T1 in FIG. 18) less than about 1 nm. Such a narrow spacing may cause difficulty in filling in a gate metal fill layer later on without leaving voids therein. Therefore, a conventional GAA process flow often elects to fill up the spacing 266 with the first WF layer 264. In other words, the first WF layer 264 in a conventional GAA process flow may be deposited to reach a thickness that closes the spacing 266 (T1=0). However, top and bottom surfaces of a nanosheet facing an adjacent nanosheet would thus "see" portions of a WF layer in the spacing 266 that have about twice a thickness that sidewall surfaces of a nanosheet would "see." This results in WF layer thickness nonuniformity from the aspect of a channel member. In the present disclosure, the spacing 266 between adjacent nanosheets 216 is intentionally left often.

Figure 19:
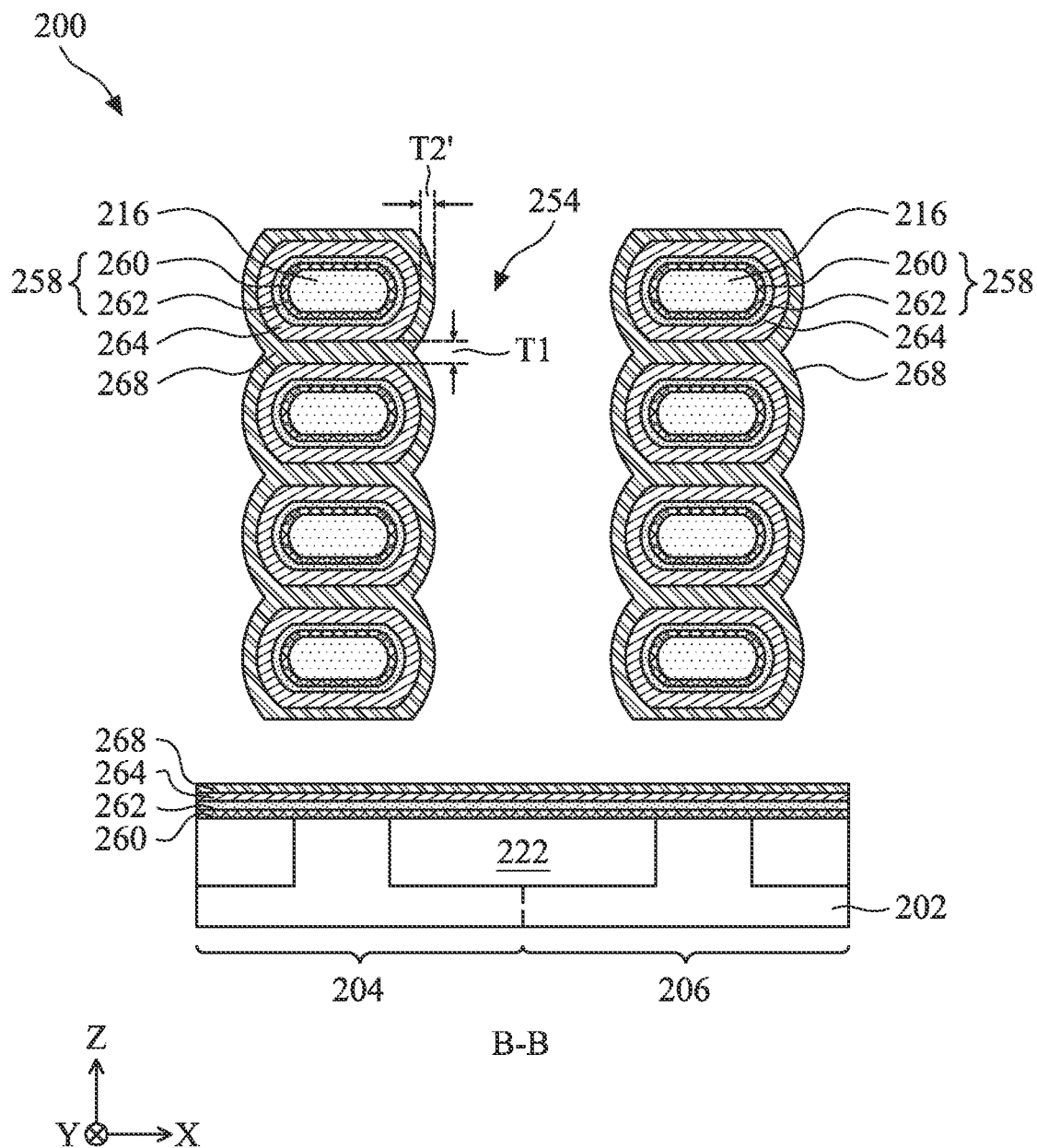

At operation 130, the method 100 (FIG. 1B) forms a first WF isolation layer 268 wrapping the first WF layer 264 in both regions 204 and 206, as shown in FIG. 19 which is a cross-sectional view along B-B line of the device 200 in FIG. 6. The first WF isolation layer 268 completely fills the spacing 266 between adjacent stacked nanosheets 216. In some embodiments, the first WF isolation layer 268 includes semiconductive material, such as silicon (Si), germanium (Ge), silicon germanium (SiGe), gallium arsenide (GaAs), indium phosphide (InP), or other suitable semiconductive material. The WF isolation layer 268 may be formed by a chemical vapor deposition (CVD) process or an atomic layer deposition (ALD) process. In furtherance of the embodiments, the first WF isolation layer 268 is a silicon (Si) layer. In one example, the silicon layer includes polysilicon. In another example, the silicon layer includes amorphous silicon. Silane ($SiH_4$) can be employed as a chemical gas in the CVD or ALD process to form the silicon layer. In one embodiment, the first WF isolation layer 268 is formed by a highly conformal deposition process such as ALD in order to ensure a uniform growth rate everywhere surrounding each of the first WF layer 264. Therefore, when portions of the first WF isolation layer 268 between adjacent stacked nanosheets 216 reach a thickness T1 and fill up the spacing 266, other portions of the first WF isolation layer 268 on sidewall surfaces of the nanosheets 216 (or sidewall surfaces of the first WF layer 264) reach a thickness T2 that is about half of T1 (T2≈T1/2). The thickness of the first WF isolation layer 268 between adjacent stacked nanosheets 216 (i.e., T1) may range from about 0.5 nm to about 2 nm. After the spacing 266 is closed, the method 100 may optionally continue to grow the thickness of the first WF isolation layer 268 on sidewall surfaces of the nanosheets 216 (i.e., T2). In some embodiments, T2 may remain smaller than T1 (but at least half of T1), such as from about 0.25 nm to about 2 nm; alternatively, T2 may be larger than T1, such as from about 2 nm to about 3 nm. In various embodiments, a ratio of T2/T1 ranges from about 0.5 to about 1.5. The ratio T2/T1 is at least 0.5 to have the gaps between adjacent stacked nanosheets 216 fully closed. The ratio T2/T1 is less than about 1.5 to avoid a too large distance between the first WF layer 264 and a to-be-formed gate metal fill which may results in weak gate drive capability. The first WF isolation layer 268 separates the first WF layer 264 over neighboring nanosheets 216 from touching. Accordingly, each nanosheet 216 is wrapped by a first WF layer 264 of a substantially uniform thickness. The Vt uniformity is thereby improved. Further, using semiconductive material, such as silicon, as a WF isolation layer has the benefit of preventing metal elements in the first WF layer 264, such as aluminum, from oxidation due to the strong oxygen affinity of silicon. Thus, the first WF isolation layer 268 also mitigates Vt shifting otherwise caused by WF metal oxidation.

Figure 20:
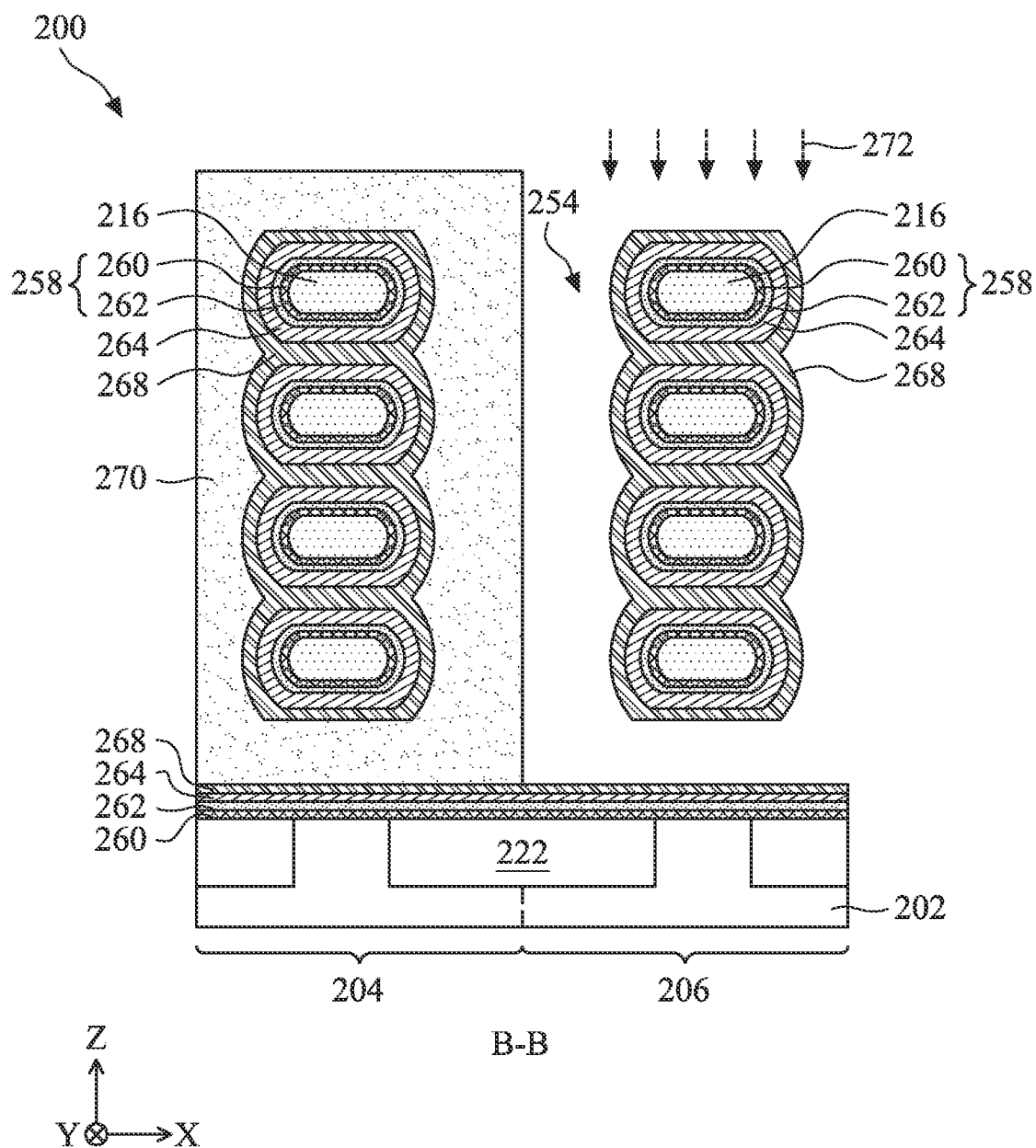
Figure 21:
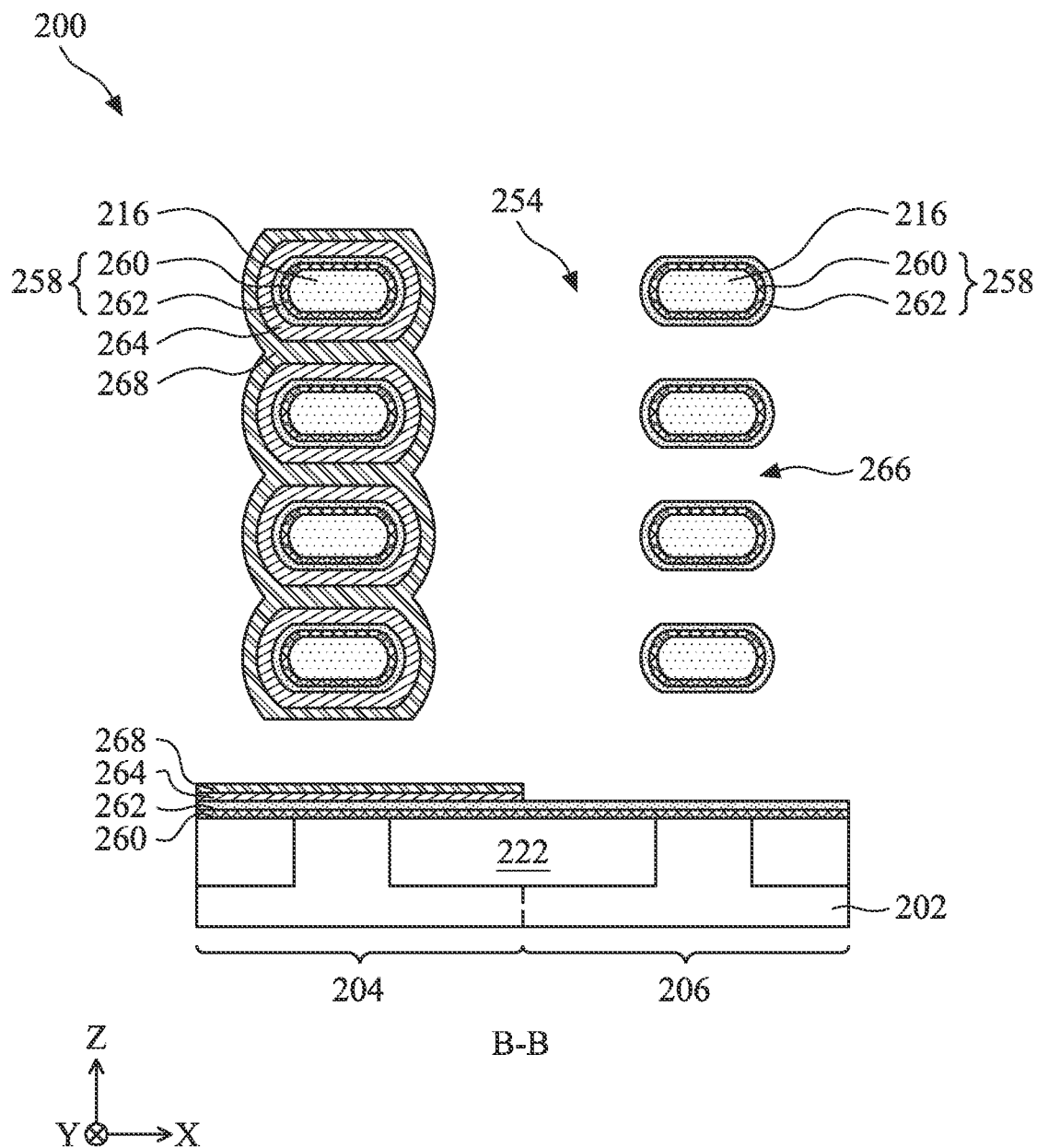

At operation 132, the method 100 (FIG. 1B) removes the first WF isolation layer 268 and the first WF layer 264 from the PFET region 206. Referring to FIG. 20 which is a cross-sectional view along B-B line of the device 200 in FIG. 6, the method 100 forms a masking element 270 covering the NFET region 204. In an embodiment, the masking element 270 includes a resist patterned with a photolithography process and may further include a resist under-layer such as a bottom anti-reflective coating (BARC). The photolithography process may include forming a resist layer overlying the regions 204 and 206, exposing the resist to a pattern, performing post-exposure bake processes, and developing the resist to remove its portion over the PFET region 206 and to form the masking element 270. Subsequently, the method 100 performs an etching process to remove the first WF isolation layer 268 and the first WF layer 264 from the exposed portion of the trench 254, while the gate dielectric layer 258 remains substantially intact. The spacing 266 between adjacent stacked nanosheets 216 in the PFET region 206 is exposed again. The etching process uses an etchant 272. In an embodiment, the etchant 272 includes phosphoric acid (or orthophosphoric acid), such as 85% (in weight) of $H_3PO_4$ in an aqueous solution (e.g., $H_2O$). To further this embodiment, the etchant 272 is a mixture of phosphoric acid with other components such as hydrogen peroxide ($H_2O_2$), Nitric acid ($HNO_3$), Sulfuric acid ($H_2SO_4$), deionized water (DIW), ammonium hydroxide ($NH_4OH$), ozone ($O_3$), hydrofluoric acid (HF), hydrochloric acid (HCl), other acidic solutions and organic oxidizer, or a combination thereof. In embodiments, the ratio of phosphoric acid in the mixture is about 1:5 to about 1:50. In various embodiments, the etching process may be performed at a temperature of about 20 degrees Celsius to about 80 degrees Celsius. The masking element 270 is then removed in a suitable process such as etching, resist stripping or plasma ashing. The resultant structure after operation 132 is shown in FIG. 21 which is a cross-sectional view along B-B line of the device 200 in FIG. 6.

Figure 22:
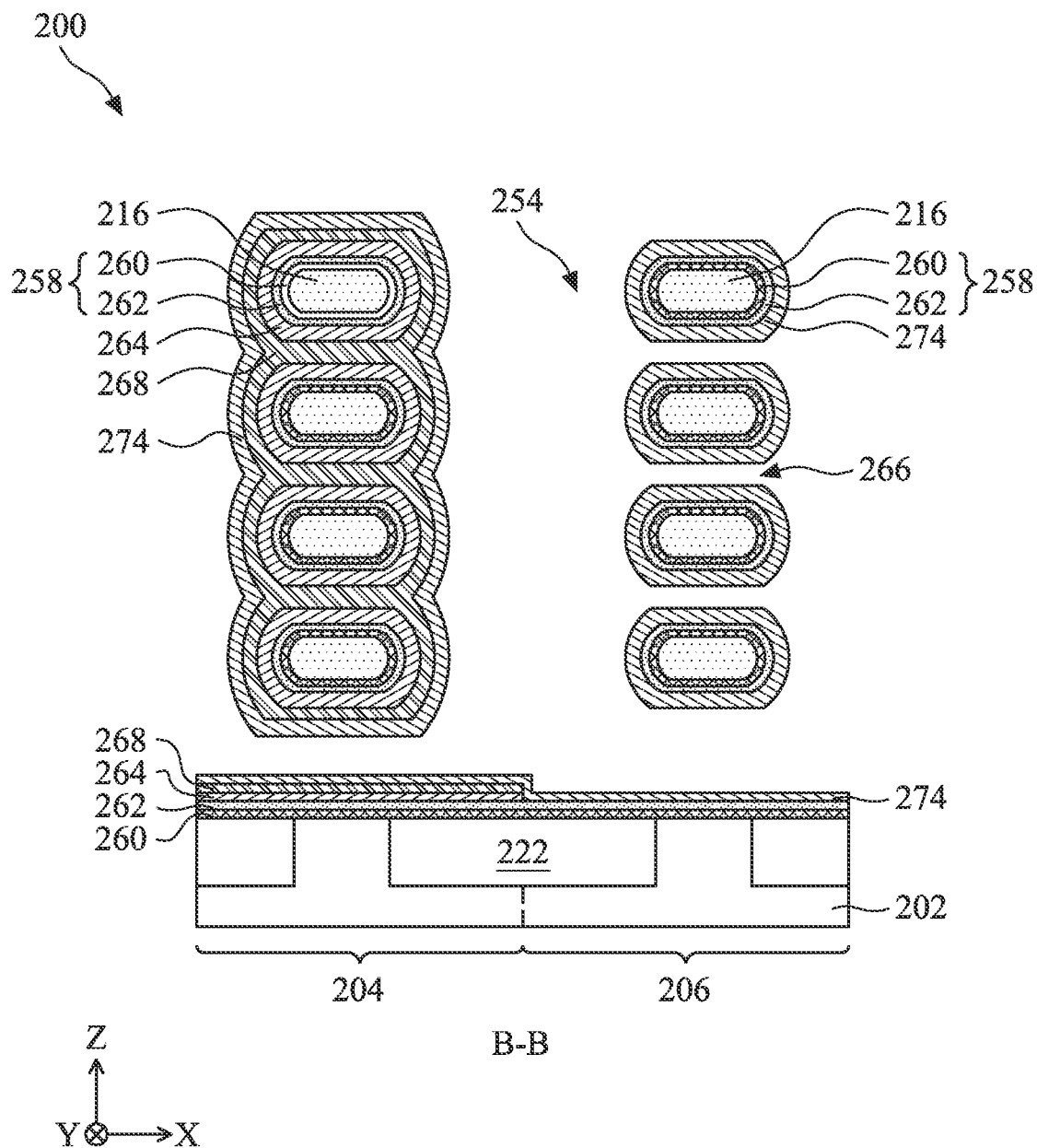

At operation 134, the method 100 (FIG. 1B) forms a second WF layer 274 in both regions 204 and 206, as shown in FIG. 22 which is a cross-sectional view along B-B line of the device 200 in FIG. 6. The second WF layer 274 wraps the first WF isolation layer 268 in the NFET region 204 and wraps the gate dielectric layer 258 (and barrier layer if formed) in the PFET region 206. In the NFET region 204, since the first WF isolation layer 268 fills up gaps between adjacent stacked nanosheets 216, the second WF layer 274 is deposited on topmost and bottommost surfaces and sidewall surfaces of the nanosheets 216 collectively as a whole, but not between adjacent stacked individual nanosheets 216. The second WF layer 274 may include materials such as metal, metal carbide, metal nitride, or other suitable materials. In the present embodiment, the second WF layer 274 includes a p-type work function material that is suitable for forming a PFET in the PFET region 206. In some embodiments, the second WF layer 274 may include materials such as ruthenium, palladium, platinum, cobalt, nickel, conductive metal oxides, e.g., ruthenium oxide, other suitable materials, or the combinations thereof. In one embodiment, the second WF layer 274 includes TiN. The second WF layer 274 is capable of providing a work function value of about 4.8 eV or more. In the NFET region, the first WF layer 264 and the second WF layer 274 may form a combined work function value for the n-type GAA device. Since the second WF layer 274 is distant from the nanosheet 216 by the first WF isolation layer 268 and the first WF layer 264 therebetween, the first WF layer 264 remains dominant in determining a work function value of the n-type GAA device. In the PFET region 206, the spacing 266 between adjacent nanosheets 216 is intentionally left often.

Figure 23:
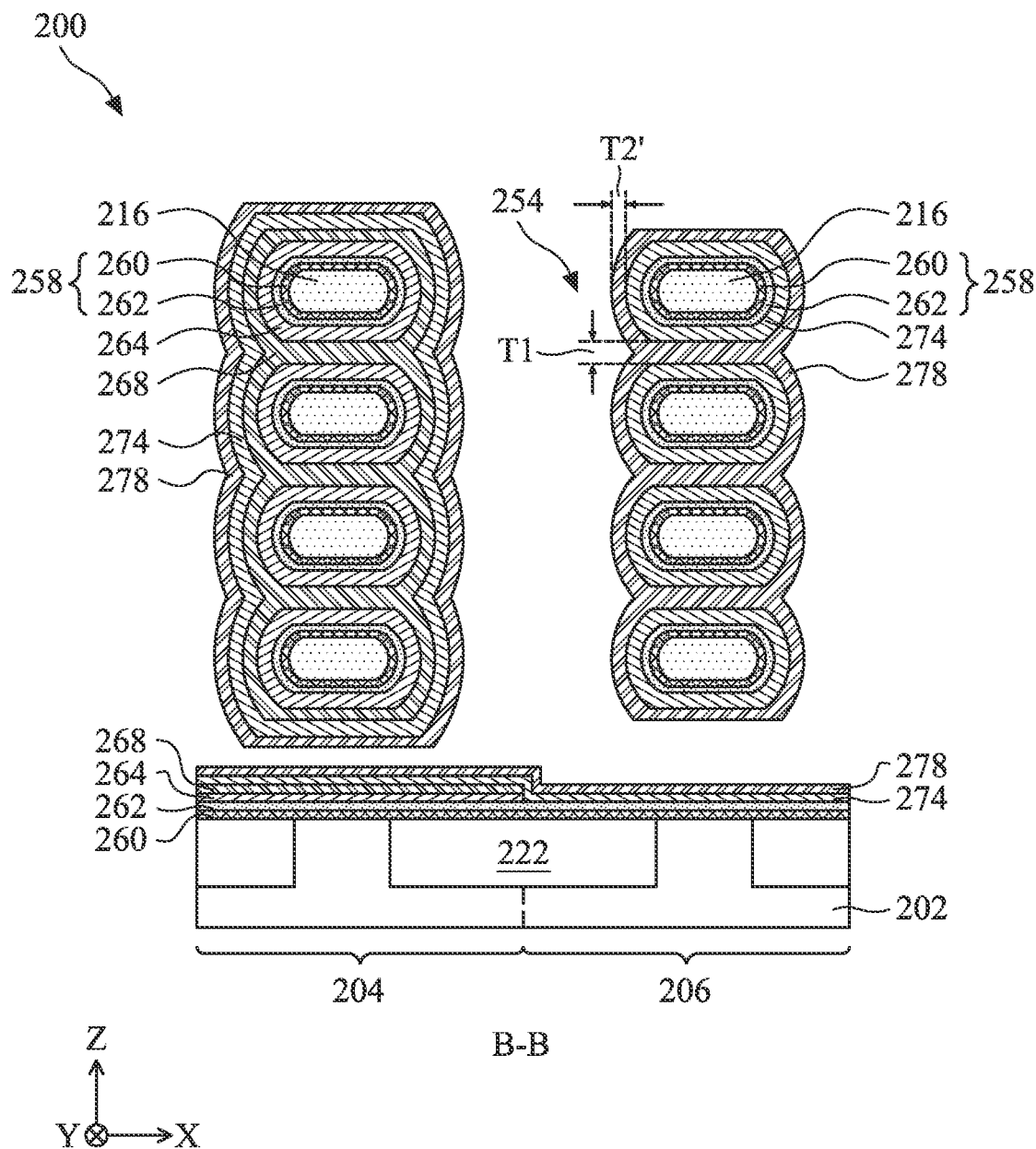

At operation 136, the method 100 (FIG. 1B) forms a second WF isolation layer 278 wrapping the second WF layer 274 in both regions 204 and 206, as shown in FIG. 23 which is a cross-sectional view along B-B line of the device 200 in FIG. 6. The second WF isolation layer 278 completely fills the spacing 266 between adjacent stacked nanosheets 216 in the PFET region 206. In some embodiments, the second WF isolation layer 278 includes a tantalum-containing material, such as Ta, TaN, TaNH, TaHF, TaHfN, TaBSi, TaBSiN, TaB, TaBN, TaSi, TaSiN, TaGe, TaGeN, TaZr, TaZrN, other tantalum-containing materials, or combinations thereof. In furtherance of the embodiments, the second WF isolation layer 278 is a tantalum nitride (TaN) layer. In some alternative embodiments, the second WF isolation layer 278 includes a niobium-containing material, such as niobium oxide (NbO), niobium nitride (NbN), other niobium-containing materials, or combinations thereof. In some other embodiments, the second WF isolation layer 278 is a metal alloy nitride layer, such as a titanium aluminum nitride (TiAlN) layer. The second WF isolation layer 278 may be formed by a chemical vapor deposition (CVD) process or an atomic layer deposition (ALD) process. In one embodiment, the second WF isolation layer 278 is formed by a highly conformal deposition process such as ALD in order to ensure a uniform growth rate everywhere surrounding each of the second WF layer 274. Therefore, when portions of the second WF isolation layer 278 between adjacent stacked nanosheets 216 in the PFET region 206 reach a thickness T1' and fill up the spacing 266, other portions of the second WF isolation layer 278 on sidewall surfaces of the nanosheets 216 (or sidewall surfaces of the second WF layer 274) reach a thickness T2' that is about half of T1' (T2' T172). The thickness of the second WF isolation layer 278 between adjacent stacked nanosheets 216 (i.e., T1') may range from about 0.5 nm to about 2 nm. After the spacing 266 is closed, the method 100 may optionally continue to grow the thickness of the second WF isolation layer 278 on sidewall surfaces of the nanosheets 216 (i.e., T2'). In some embodiments, T2' may remain smaller than T1' (but at least half of T1'), such as from about 0.25 nm to about 2 nm; alternatively, T2' may be larger than T1', such as from about 2 nm to about 3 nm. In various embodiments, a ratio of T2'/T1' ranges from about 0.5 to about 1.5. The ratio T2'/T1' is at least 0.5 to have the gaps between adjacent stacked nanosheets 216 fully closed. The ratio T2'/T1' is less than about 1.5 to avoid a too large distance between the second WF layer 264 and a to-be-formed gate metal fill which may results in weak gate drive capability.

In the NFET region 204, the second WF isolation layer 278 is deposited on topmost and bottommost surfaces and sidewall surfaces of the nanosheets 216 collectively as a whole, but not between adjacent stacked individual nanosheets 216. In various embodiments, the thickness of the second WF isolation layer 278 in the NFET region 204 may independently equal to, or be thicker or thinner than, the thickness of the first WF isolation layer 268 on the sidewall surfaces of the nanosheets 216. In the PFET region 206, the second WF isolation layer 278 separates the second WF layer 274 on adjacent nanosheets 216 from touching. Accordingly, each nanosheet 216 is wrapped by a second WF layer 274 of substantially uniform thickness. The Vt uniformity for p-type GAA devices is improved. Further, for a WF isolation layer in some instances containing metal nitride or metal alloy nitride has the benefit of preventing metal element in the second WF layer 274, such as titanium, from oxidation due to stronger oxygen affinity. Thus, the second WF isolation layer 278 also mitigates Vt shifting otherwise caused by WF metal oxidation.

Even though the second WF layer 274 and the second WF isolation layer 278 are not intended for the work function of n-type GAA devices in the NFET region 204, it is nonetheless deposited into both the regions 204 and 206. One consideration is that selectively depositing the second WF layer 274 and the second WF isolation layer 278 might require part of the device 200 to be covered for extra times with an organic material, such as a photoresist (or resist), that might contaminate WF layers during deposition. Therefore, depositing the second WF layer 274 and the second WF isolation layer 278 simultaneously into the regions 204 and 206 simplifies process and improves work function layer purity.

Figure 24:
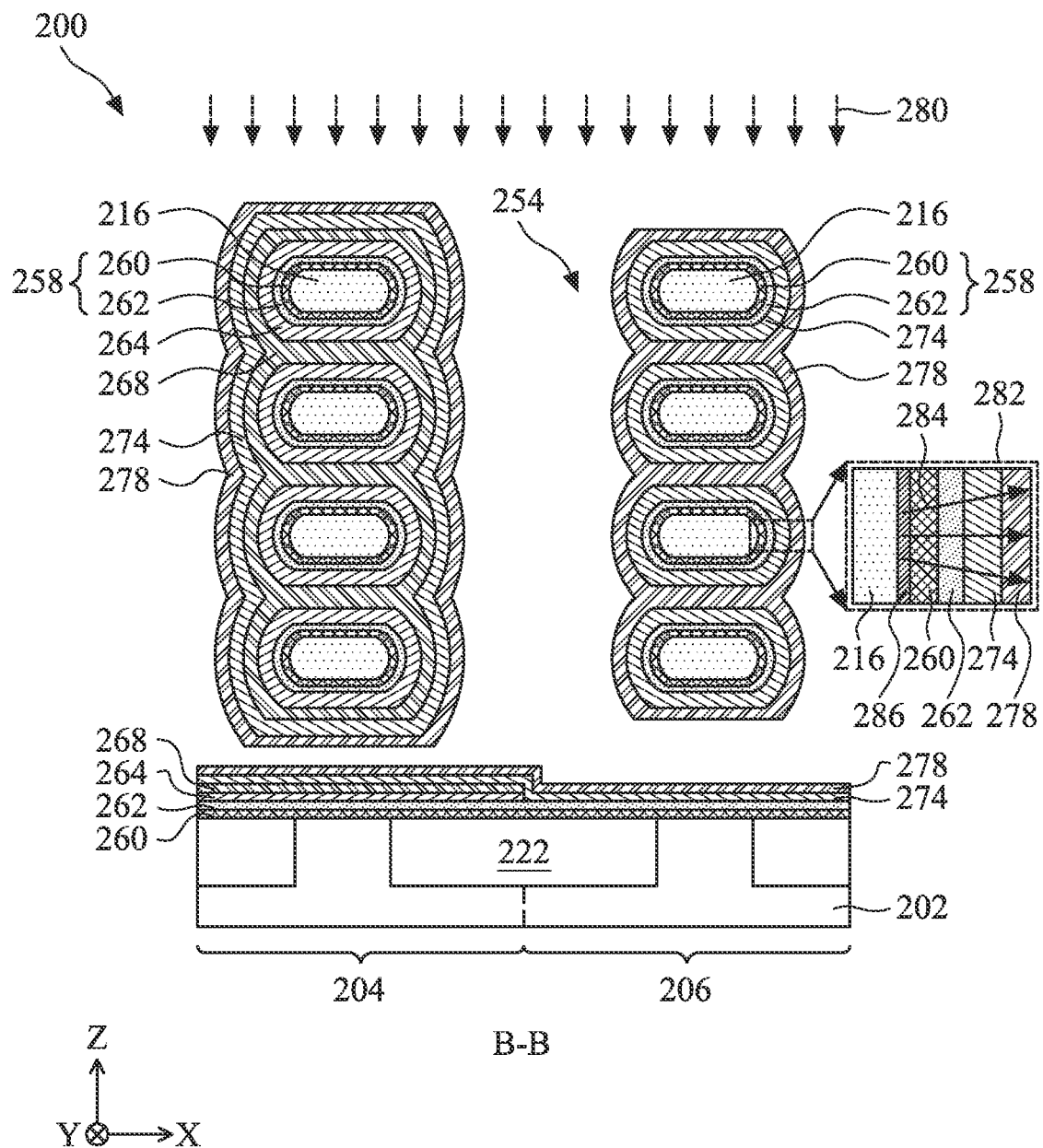

Referring to FIG. 24 which is a cross-sectional view along B-B line of the device 200 in FIG. 6, in some embodiments, method 100 may optionally include an annealing process (represented by arrows 280) to trigger an oxygen depriving process. For the second WF isolation layer 278 including a metal nitride (e.g. TaN, TaSiN, TiSiN) or a metal alloy nitride (e.g. TiAlN), the second WF isolation layer 278 has a higher affinity for oxygen than silicon in the interfacial layer 260 and can deprive oxygen from the interfacial layer 260 at elevated temperature, particularly in the PFET region 206 where the second WF isolation layer 278 is closer to the interfacial layer 260 than in the NFET region 204. The oxygen depriving process chemically reduces the interfacial layer 260 in the PFET region 206. The interfacial layer 260 in the PFET region 206 thus has a reduced thickness (e.g., about 10% to about 50% thinner), which is smaller than that of the interfacial layer 260 in the NFET region 204, or may even be eliminated (fully converted). The oxygen depriving process provides an option in adjusting interfacial layer thickness to enhance circuit design flexibility. The oxygen depriving process may be performed using spike annealing, with the time duration being milliseconds, for example, between about 10 milliseconds and about 500 milliseconds. The temperatures of the respective wafer may be in the range between about 400 degrees Celsius and about 700 degrees Celsius. The oxygen depriving process deprives oxygen from at least the bottom portion of the interfacial layers 260 in the PFET region 206, and hence the silicon in the interfacial layer 260 remains to form an additional silicon layer on top of the crystalline silicon layer of the nanosheets 216. FIG. 24 illustrates a magnified view of a portion 282. Arrows 284 are shown to indicate the movement of oxygen atoms due to the depriving. Accordingly, an amorphous silicon layer 286 is formed. The additional silicon layer is formed of the remaining silicon of the interfacial layer 260 after oxygen is deprived from the bottom portion of the interfacial layer 260. During the oxygen depriving process, the high-k dielectric layer 262 may intermix with the top portion of the interfacial layers 260 and the oxygen scavenged from the bottom portion of the interfacial layers 260 to form an intermix compound, which may be a metal silicate. The intermix compound is likely to have increased oxygen content. For example, when the high-k dielectric layer 262 comprises $HfO_2$, intermix compound comprises hafnium silicate ($HfSiO_4$). When the high-k dielectric layer 262 comprises $ZrO_2$, intermix compound comprises zirconium silicate ($ZrSiO_4$).

Figure 25:
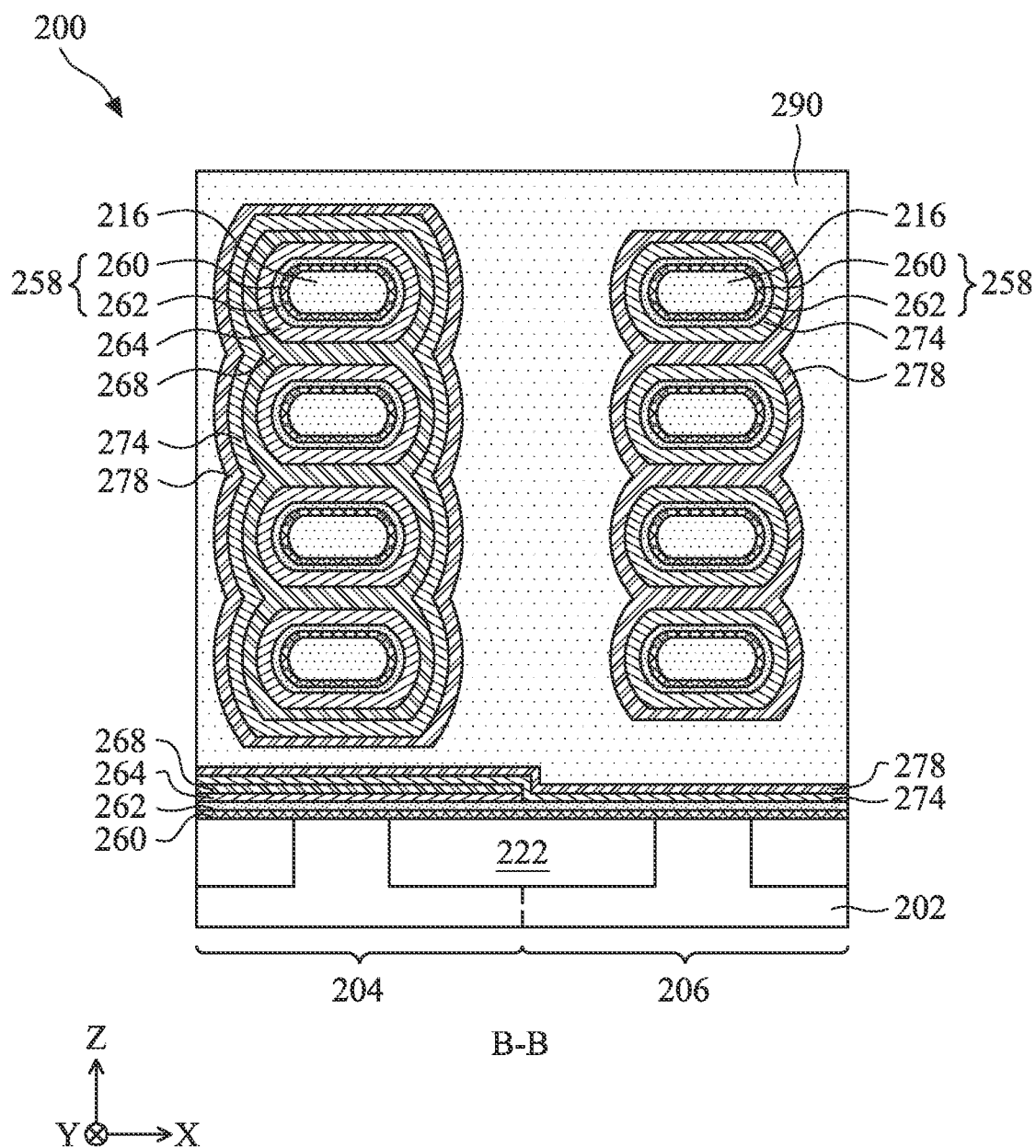

At operation 138, the method 100 (FIG. 1B) performs further operations in order to form a final device. For example, the method 100 may form a gate metal fill layer 290 in the remaining spaces of the gate trenches 254, as shown in FIG. 25 which is a cross-sectional view along B-B line of the device 200 in FIG. 6. The gate metal fill layer 290 may include aluminum (Al), tungsten (W), cobalt (Co), copper (Cu), and/or other suitable materials. The gate metal fill layer 290 may be formed by CVD, PVD, plating, and/or other suitable processes. A CMP process may be performed to remove excess materials from the gate structures in the regions 204 and 206 so as to planarize a top surface of the device 200. Yet further operations may follow. For example, operation 138 may form contacts and vias electrically connecting source/drain features and gate metal fill layers and form metal interconnects connecting the multi-gate devices to other portions of the device 200 to form a complete IC.

Figure 26:
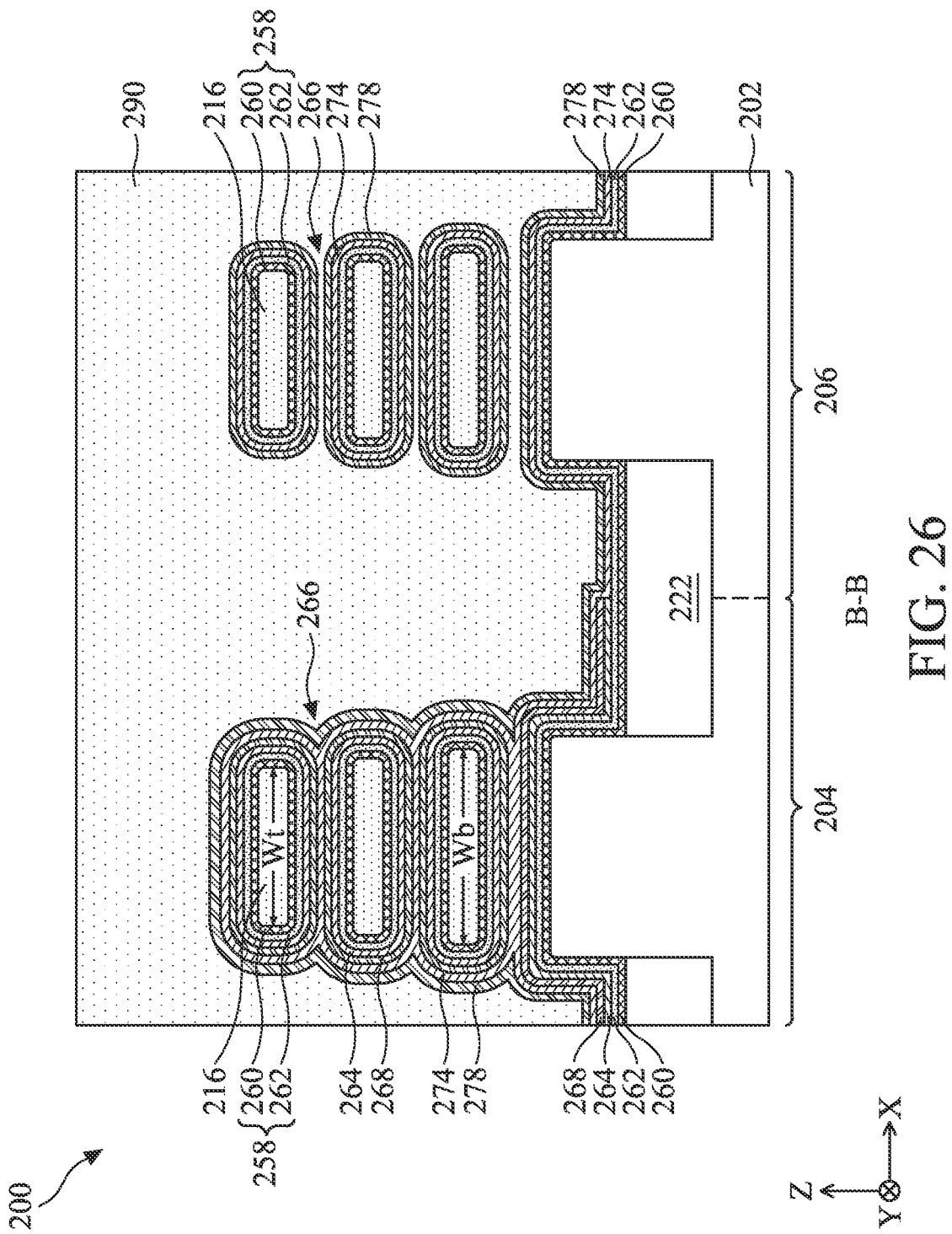
FIG. 26 is a fragmentary cross-sectional view of an alternative embodiment of a semiconductor device in FIG. 6 taken along a second cut B-B at intermediate stages of an embodiment of the method of FIGS. 1A and 1B in accordance with some embodiments of the present disclosure.

Reference is now made to FIG. 26. FIG. 26 shows a cross-sectional view along B-B line of an alternative embodiment of the device 200 at the conclusion of operation 138. Like reference numerals are used to denote like features. Some processes and materials used to form the alternative embodiment of the device 200 may be similar to or the same as what has been described previously in association with FIGS. 1A-25, and are not repeated herein. It is noted that in FIG. 25, the stacked nanosheets 216 in either the NFET region 204 or the PFET region 206 have substantially the same width in the x-direction, which is for illustrative purposes only. The stacked nanosheets 216 may have different widths in other embodiments. As shown in FIG. 26, the nanosheets 216 from top to bottom have gradually larger widths, such as the smallest width Wt at the topmost nanosheet and the largest width Wb at the bottommost nanosheet, which may be due to etch loading effects during the fin formation at operation 106. In some embodiments, the ratio of Wb/Wt is constrained to be no larger than 1.3. As if the ratio of Wb/Wt is larger than 1.3, the nonuniformity of channel layer widths may deteriorate device performance. Another difference between the embodiments illustrated in FIGS. 25 and 26 is that the first WF isolation layer 268 in the NFET region 204 and the second WF isolation layer 278 in the PFET region 206 as shown in FIG. 26 do not entirely fill up respective spacing 266 between adjacent stacked nanosheets 216. Portions of the first WF isolation layer 268 in the NFET region 204 and the second WF isolation layer 278 in the PFET region 206 conformally wraps each respective individual nanosheet 216 without connecting continuously. Instead, the second WF layer 274 fills the spacing 266 in the NFET region 204, and the gate metal fill layer 290 fills the spacing 266 in the PFET region 206, as shown in FIG. 26.

Although not intended to be limiting, one or more embodiments of the present disclosure provide many benefits to a semiconductor device and the formation thereof. The present disclosure provides methods of forming GAA devices with WF isolation layers wrapping work function layers. The WF isolation layers safeguards a thickness uniformity of the work function layers. Accordingly, this provides a benefit of less threshold voltage fluctuation and better uniformity of device performance. Furthermore, the GAA flow with WF isolation layer formation method can be easily integrated into existing semiconductor fabrication processes.

In one exemplary aspect, the present disclosure is directed to an n-type field effect transistor. The n-type field effect transistor includes semiconductor channel members vertically stacked over a substrate, a gate dielectric layer wrapping around each of the semiconductor channel members, a work function (WF) layer disposed over the gate dielectric layer and wrapping around each of the semiconductor channel members, a WF isolation layer disposed over the WF layer and filling gaps between adjacent semiconductor channel members, and a gate metal fill layer disposed over the WF isolation layer. In some embodiments, the WF isolation layer includes semiconductive material. In some embodiments, the semiconductive material is amorphous silicon. In some embodiments, the semiconductive material is polysilicon. In some embodiments, the gate metal fill layer is not disposed in the gaps. In some embodiments, a thickness of the WF isolation layer disposed over sidewall surfaces of the semiconductor channel members is smaller than a thickness of the WF isolation layer disposed in the gaps. In some embodiments, a thickness of the WF isolation layer disposed over sidewall surfaces of the semiconductor channel members is larger than a thickness of the WF isolation layer disposed in the gaps. In some embodiments, the WF layer is a first WF layer and the WF isolation layer is a first WF isolation layer, and the n-type field effect transistor further includes a second WF layer disposed over the first WF isolation layer and a second WF isolation layer disposed over the second WF layer, in which the gate metal fill layer is disposed over the second WF isolation layer. In some embodiments, the first and second WF layers are of opposite conductive types. In some embodiments, the second WF isolation layer is a tantalum-containing layer. In some embodiments, the second WF isolation layer is a metal alloy nitride layer.

In another exemplary aspect, the present disclosure is directed to a semiconductor device. The semiconductor device includes a substrate having a first region and a second region, a first gate-all-around (GAA) device located in the first region, in which the first GAA device includes a plurality of first nanosheets vertically stacked above the substrate, a first work function (WF) layer of a first conductive type wrapping each of the first nanosheets, and a first WF isolation layer disposed over the first WF layer and wrapping each of the first nanosheets. The semiconductor device also includes a second GAA device located in the second region, in which the second GAA device includes a plurality of second nanosheets vertically stacked above the substrate, a second WF layer of a second conductive type wrapping each of the second nanosheets, wherein the first and second conductive types are opposite, and a second WF isolation layer disposed over the second WF layer and wrapping each of the second nanosheets. The first and second WF isolation layers include different material compositions. In some embodiments, the first WF isolation layer is a semiconductive layer and the second WF isolation layer is a metal nitride layer. In some embodiments, the first WF layer has a substantially uniform thickness surrounding each of the first nanosheets, and the second WF layer has a substantially uniform thickness surrounding each of the second nanosheets. In some embodiments, the second WF layer is also disposed over the first WF isolation layer in the first region. In some embodiments, the second WF isolation layer is also disposed over the second WF layer in the first region.

In another exemplary aspect, the present disclosure is directed to a method of manufacturing a semiconductor device. The method includes forming a structure having a plurality of nanosheets vertically stacked above a substrate, depositing a gate dielectric layer surrounding each of the nanosheets, depositing a metal layer over the gate dielectric layer and surrounding each of the nanosheets, depositing a semiconductive layer over the metal layer and surrounding each of the nanosheets, wherein the semiconductive layer fills gaps between neighboring nanosheets, and forming a metal fill layer over the semiconductive layer and surrounding the nanosheets but not in the gaps. In some embodiments, the semiconductive layer is a silicon layer. In some embodiments, the metal layer is an n-type work function layer. In some embodiments, the method further includes prior to the forming of the metal fill layer, depositing a metal nitride layer over the semiconductive layer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An n-type field effect transistor, comprising:
   semiconductor channel members vertically stacked over a substrate;
   a gate dielectric layer wrapping around each of the semiconductor channel members;
   a first work function (WF) layer disposed over the gate dielectric layer and wrapping around each of the semiconductor channel members;
   a first WF isolation layer disposed over the first WF layer and filling gaps between adjacent semiconductor channel members;
   a second WF layer disposed over the first WF isolation layer;
   a second WF isolation layer disposed over the second WF layer, wherein the second WF isolation layer is a metal alloy nitride layer; and
   a gate metal fill layer disposed over the second WF isolation layer.

2. The n-type field effect transistor of claim 1, wherein the first WF isolation layer includes semiconductive material.

3. The n-type field effect transistor of claim 2, wherein the semiconductive material is amorphous silicon.

4. The n-type field effect transistor of claim 2, wherein the semiconductive material is polysilicon.

5. The n-type field effect transistor of claim 1, wherein the gate metal fill layer is not disposed in the gaps.

6. The n-type field effect transistor of claim 1, wherein a thickness of the first WF isolation layer disposed over sidewall surfaces of the semiconductor channel members is smaller than a thickness of the first WF isolation layer disposed in the gaps.

7. The n-type field effect transistor of claim 1, wherein a thickness of the first WF isolation layer disposed over sidewall surfaces of the semiconductor channel members is larger than a thickness of the first WF isolation layer disposed in the gaps.

8. The n-type field effect transistor of claim 1, wherein the first and second WF layers are of opposite conductive types.

9. A semiconductor device, comprising:
   a substrate having a first region and a second region;
   a first gate-all-around (GAA) device located in the first region, the first GAA device including:
      a plurality of first nanosheets vertically stacked above the substrate,
      a first work function (WF) layer of a first conductive type wrapping each of the first nanosheets, and
      a first WF isolation layer disposed over the first WF layer and wrapping each of the first nanosheets; and
   a second GAA device located in the second region, the second GAA device including:
      a plurality of second nanosheets vertically stacked above the substrate,
      a second WF layer of a second conductive type wrapping each of the second nanosheets, wherein the first and second conductive types are opposite, and
      a second WF isolation layer disposed over the second WF layer and wrapping each of the second nanosheets, wherein the first WF isolation layer is a semiconductive layer and the second WF isolation layer is a metal nitride layer.

10. The semiconductor device of claim 9, wherein the first WF layer has a substantially uniform thickness surrounding each of the first nanosheets, and the second WF layer has a substantially uniform thickness surrounding each of the second nanosheets.

11. The semiconductor device of claim 9, wherein the second WF layer is also disposed over the first WF isolation layer in the first region.

12. The semiconductor device of claim 11, wherein the second WF isolation layer is also disposed over the second WF layer in the first region.

13. A method of manufacturing a semiconductor device, comprising:
   forming a structure having a plurality of nanosheets vertically stacked above a substrate;
   depositing a gate dielectric layer surrounding each of the nanosheets;
   depositing a metal layer over the gate dielectric layer and surrounding each of the nanosheets;
   depositing a semiconductive layer over the metal layer and surrounding each of the nanosheets, wherein the semiconductive layer fills gaps between neighboring nanosheets;

depositing a metal nitride layer surrounding the semiconductive layer but not in the gaps; and forming a metal fill layer over the metal nitride layer and surrounding the nanosheets but not in the gaps.

14. The method of claim 13, wherein the semiconductive layer is a silicon layer.

15. The method of claim 13, wherein the metal layer is an n-type work function layer.

16. The method of claim 13, further comprising:

prior to the forming of the metal fill layer, depositing a metal alloy nitride layer surrounding the metal nitride layer but not in the gaps.

17. The method of claim 1, wherein the second WF isolation layer is a titanium aluminum nitride layer.

18. The method of claim 1, wherein the first WF isolation layer is thicker than the second WF isolation layer.

19. The method of claim 1, wherein the first WF isolation layer is thinner than the second WF isolation layer.

20. The method of claim 9, wherein the semiconductive layer includes amorphous silicon or polysilicon.

* * * * *